US007304827B2

(12) United States Patent
Chen et al.

(10) Patent No.: US 7,304,827 B2
(45) Date of Patent: Dec. 4, 2007

(54) ESD PROTECTION CIRCUITS FOR MIXED-VOLTAGE BUFFERS

(76) Inventors: Zi-Ping Chen, Bldg. 51, 195, Chung Hsing Rd., Sec. 4, Chutung, Hsinchu (TW) 310; Ming-Dao Ker, Bldg. 51, 195, Chung Hsing Rd., Sec. 4, Chutung, Hsinchu (TW) 310; Hsin-Chin Jiang, Bldg. 51, 195, Chung Hsing Rd., Sec. 4, Chutung, Hsinchu (TW) 310

( * ) Notice: Subject to any disclaimer, the term of this patent is extended or adjusted under 35 U.S.C. 154(b) by 305 days.

(21) Appl. No.: 10/428,047

(22) Filed: May 2, 2003

(65) Prior Publication Data

US 2004/0218322 A1 Nov. 4, 2004

(51) Int. Cl.
*H02H 9/00* (2006.01)
(52) U.S. Cl. ........................................ 361/56
(58) Field of Classification Search ............... 361/111, 361/56, 91, 54; 257/362
See application file for complete search history.

(56) References Cited

U.S. PATENT DOCUMENTS

| | | | | |
|---|---|---|---|---|
| 5,255,146 | A * | 10/1993 | Miller | 361/56 |
| 5,631,793 | A * | 5/1997 | Ker et al. | 361/56 |
| 5,744,842 | A * | 4/1998 | Ker | 257/362 |
| 5,910,874 | A | 6/1999 | Iniewski et al. | |
| 5,932,918 | A | 8/1999 | Krakauer | |
| 5,959,820 | A * | 9/1999 | Ker et al. | 361/111 |
| 6,249,410 | B1 * | 6/2001 | Ker et al. | 361/56 |
| 6,392,860 | B1 * | 5/2002 | Lin et al. | 361/111 |
| 6,576,958 | B2 * | 6/2003 | Ker et al. | 257/355 |
| 6,631,060 | B2 | 10/2003 | Su et al. | |
| 2003/0076645 | A1 * | 4/2003 | Ker et al. | 361/111 |

OTHER PUBLICATIONS

T. Furukawa et al., "Accelerated gate-oxide breakdown in mixed-voltage I/O circuits," in Proc. of IEEE Int. Reliability Physics Symp., 1997, pp. 169-173.
E. Takeda and N. Suzuki, "An empirical model for device degradation due to hot-carrier injection," IEEE Electron Device Letters, vol. 4, 1983, pp. 111-113.
Ming Dou Ker et al., "ESD protection design for mixed-voltage I/O buffer by using stacked-NMOS triggered SCR device," in Proc. of EOS/ESD Symp., 2001, pp. 32-43.
Warren R. Anderson et al., "ESD protection for mixed-voltage I/O using NMOS transistors stacked in a cascode configuration", in Proc. of EOS/ESD Symp., 1998, pp. 54-62.

(Continued)

Primary Examiner—Ronald W. Leja
(74) Attorney, Agent, or Firm—Berkeley Law and Technology Group LLP

(57) ABSTRACT

An ESD protection circuit that protects a mixed-voltage input/output (I/O) buffer circuit in an integrated circuit is provided. The ESD protection circuit includes an ESD discharging circuit coupled to the I/O pad and ESD detection circuit coupled to the discharging circuit providing a means for detecting an ESD and triggering the discharging circuit to conduct the ESD to ground. The ESD discharging circuit comprises stacked NMOS transistors or a field oxide device (FOD). The protection circuit can also be used in an ESD protection circuit for a high-voltage-tolerant input pad or to protect multiple input pads and/or multiple I/O pads in an integrated circuit.

35 Claims, 25 Drawing Sheets

OTHER PUBLICATIONS

Ming-Dou Ker et al., "Novel input ESD protection circuit with substrate-triggering technique in a 0.25 μm shallow-trench-isolation CMOS technology", in Proc. of IEEE Int. Symp. on Circuits and Systems, 1998, vol. 2, pp. 212-215.

Ming-Dou Ker et al., "ESD protection design in a 0.18-μm salicide CMOS technology by using substrate-triggered technique", in Proc. of IEEE Int. Symp. on Circuits and Systems, 2001, vol. 4, pp. 754-757.

* cited by examiner

ESD PROTECTION CIRCUITS FOR MIXED-VOLTAGE BUFFERS

FIELD OF THE INVENTION

This invention relates in general to electrostatic discharge (ESD) protection and, more particularly, to ESD protection circuits for mixed-voltage buffer circuits.

BACKGROUND OF THE INVENTION

A semiconductor integrated circuit (IC) is generally susceptible to an electrostatic discharge (ESD) event, which may damage or destroy the IC. An ESD event refers to a phenomenon of electrical discharge of a current (positive or negative) for a short duration during which a large amount of current is provided to the IC. Therefore, an ESD protection is necessary for all the integrated circuits and different approaches must be taken in different applications.

In a system with a positive power supply ($V_{DD}$), a relative ground or lower voltage ($V_{SS}$), and one or more input pins, an ESD may occur at one of the input pins in four different modes: positive-to-$V_{SS}$(PS) mode, negative-to-$V_{SS}$(NS) mode, positive-to-$V_{DD}$(PD) mode, and negative-to-$V_{DD}$ (ND) mode. Each of the modes is defined as follows:

PS mode: ESD at an input pin with positive polarity with respect to the $V_{SS}$ pin when the $V_{DD}$ pin and the other input/output pins are floating;

NS mode: ESD at an input pin with negative polarity with respect to the $V_{SS}$ pin when the $V_{DD}$ pin and the other input/output pins are floating;

PD mode: ESD at an input pin with positive polarity with respect to the $V_{DD}$ pin when the $V_{SS}$ pin and the other input/output pins are floating; and ND mode: ESD at an input pin with negative polarity with respect to the $V_{DD}$ pin when the $V_{SS}$ pin and the other input/output pins are floating.

In a complete system such as a computer, there are generally more than one power supply voltage. Different sub-systems use different supply voltages. Communications between such different sub-systems requires a mixed-voltage input/output (I/O) buffer circuit to transfer signals with different voltage levels, and ESD protection for such a mixed-voltage I/O buffer circuit is also necessary.

Stacked NMOS transistors, in which a diffusion region in the substrate constructs a source region of one transistor and a drain region of another, are often used in an ESD protection circuit. The diffusion region shared by the transistors renders the stacked NMOS transistors advantageous over a conventional cascade configuration of two NMOS transistors because stacked NMOS transistors have a controllable triggering voltage and a holding voltage for both transistors tailored by altering the length of the shared diffusion area. The stacked NMOS transistors are also able to avoid problems often associated with a single NMOS transistor such as hot carrier degradation and time dependent dielectric breakdown.

An example of incorporating stacked NMOS transistors in ESD protection circuits is shown in FIG. 1. An I/O pad 102 is coupled to an ESD protection circuit 110 and a driver circuit 120. Stacked NMOS transistors 112 and 122 are used in ESD protection circuit 110 and driver circuit 120, respectively. Stacked NMOS transistors 112 comprise an NMOS transistor 114 with its gate (not numbered) coupled to the power supply $V_{DD}$, and an NMOS transistor 116 with its gate (not numbered) and source (not numbered) coupled to ground, or $V_{SS}$. Stacked NMOS transistors 122 include an NMOS transistor 124 with its gate (not numbered) coupled to the power supply $V_{DD}$ and an NMOS transistor 126 to receive a driving signal from a previous stage (not shown).

Under normal operation conditions, ESD protection circuit 110 is off because the gate of NMOS transistor 116 has a bias lower than its threshold voltage. When an ESD appears on I/O pad 102, a mechanism called snapback takes place in stacked NMOS transistors 112 and conducts the ESD current to ground, or $V_{SS}$, through a substrate current in NMOS transistors 114 and 116 that turns on a parasitic lateral bipolar junction transistor (LBJT) (not shown) of stacked NMOS transistors 112. The snapback phenomenon is well-known to one skilled in the art and thus will not be described in detail.

Although stacked NMOS transistors have advantages over a single NMOS transistor, they generally have a higher trigger voltage, higher snapback breakdown voltage, and lower secondary breakdown current due to a wider base width of the LBJT as compared to that of the single NMOS transistor.

SUMMARY OF THE INVENTION

In accordance with the present invention, there is provided a buffer circuit that includes a pad, an electrostatic discharge (ESD) detection circuit coupled to the pad for detecting an ESD on the pad, and a first circuit coupled to the pad and the ESD detection circuit and connectable to a first potential for discharging the ESD on the pad, the first circuit comprising a plurality of stacked MOS transistors, wherein the ESD detection circuit provides at least a first signal to the first circuit under normal operation conditions and at least a second signal to the first circuit when the ESD detection circuit detects the ESD on the pad.

Also in accordance with the present invention, there is provided a buffer circuit that includes a pad, an electrostatic discharge (ESD) detection circuit coupled to the pad for detecting an ESD on the pad, and an ESD discharging circuit coupled to the pad and the ESD detection circuit and connectable to a first potential for discharging the ESD on the pad, the ESD discharging circuit comprising a first field oxide device (FOD), wherein the ESD detection circuit provides at least a first signal to the ESD discharging circuit under normal operation conditions of the buffer circuit and at least a second signal to the discharging circuit when the ESD detection circuit detects the ESD on the pad.

Still in accordance with the present invention, there is provided an integrated circuit (IC) connectable to a first potential and a second potential that includes at least one electrostatic discharge (ESD) protection circuit, each comprising a pad, an ESD detection circuit coupled to the pad for detecting an ESD on the pad, and a first clamping circuit coupled to the pad and the ESD detection circuit for discharging the ESD to the first potential, wherein the ESD detection circuit provides at least a first signal to the first clamping circuit under normal operation conditions of the IC and at least a second signal to the first clamping circuit for triggering the first clamping circuit to discharge the ESD to the first potential under an ESD stress condition, and a second clamping circuit connectable to the first and second potentials for providing an ESD discharging path between the first and second potentials, wherein the ESD detection circuit of each of the at least one ESD protection circuit is coupled to the second clamping circuit through a logic circuit.

Yet still in accordance with the present invention, there is provided an integrated circuit (IC) connectable to a first potential and a second potential that includes a plurality of first electrostatic discharge (ESD) protection circuits, each comprising an input pad, an ESD detection circuit coupled to the input pad for detecting an ESD on the input pad, a first clamping circuit coupled to the input pad and the first ESD detection circuit for discharging the ESD on the input pad to the first potential, a plurality of second ESD protection circuits, each comprising a contact pad, a driver circuit coupled to the contact pad, and an ESD detection circuit for detecting an ESD on the contact pad, and a second clamping circuit connectable to the first and second potentials for discharging an ESD, wherein the ESD detection circuit of each of the plurality of first ESD protection circuits and the plurality of second ESD protection circuits is coupled to the second clamping circuit through a logic circuit.

Further in accordance with the present invention, there is provided a method for providing an electrostatic discharge (ESD) protection for an integrated circuit (IC) that includes providing an ESD detection circuit for detecting an ESD on a pad, and providing an ESD discharging circuit for discharging the ESD to a first power supply terminal by using a plurality of stacked NMOS transistors.

Still further in accordance with the present invention, there is provided a method for providing an electrostatic discharge (ESD) protection for an integrated circuit (IC) that includes providing an ESD detection circuit for detecting an ESD on a pad, and providing an ESD discharging circuit for discharging the ESD to a first power supply terminal by using a field oxide device (FOD).

Yet still further in accordance with the present invention, there is provided a method for providing an electrostatic discharge (ESD) protection for an integrated circuit (IC) that includes providing an ESD detection circuit for detecting an ESD on a pad, providing a first ESD discharging circuit for discharging the ESD to a first power supply terminal, and providing a second ESD discharging circuit for providing an ESD discharging path between the first power supply terminal and a second power supply terminal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

In accordance with one embodiment of the present invention, stacked NMOS transistors are used in an ESD protection circuit.

Figure 1:
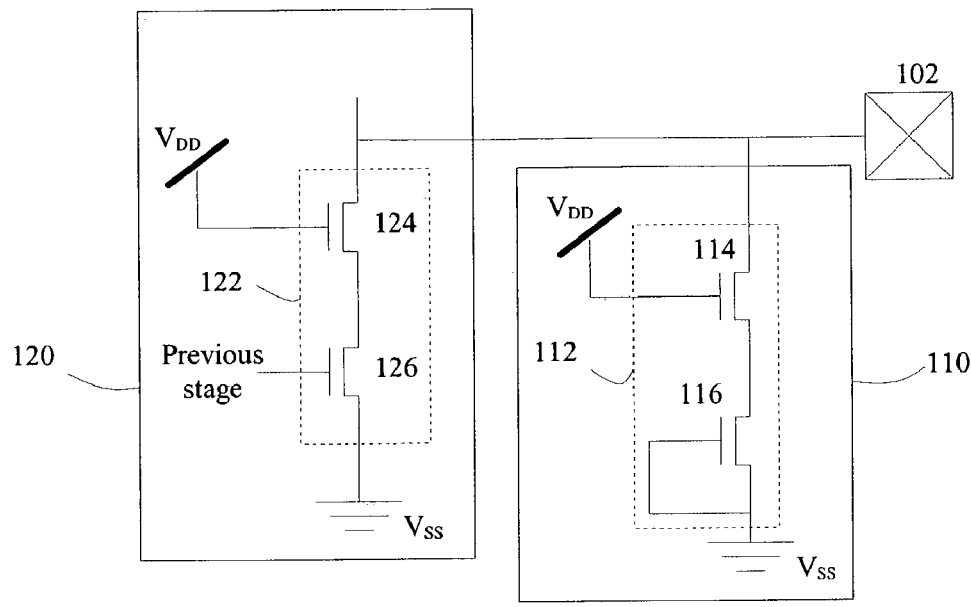
FIG. 1 is a conventional mixed-voltage I/O buffer circuit using stacked NMOS transistors.
Figure 2:
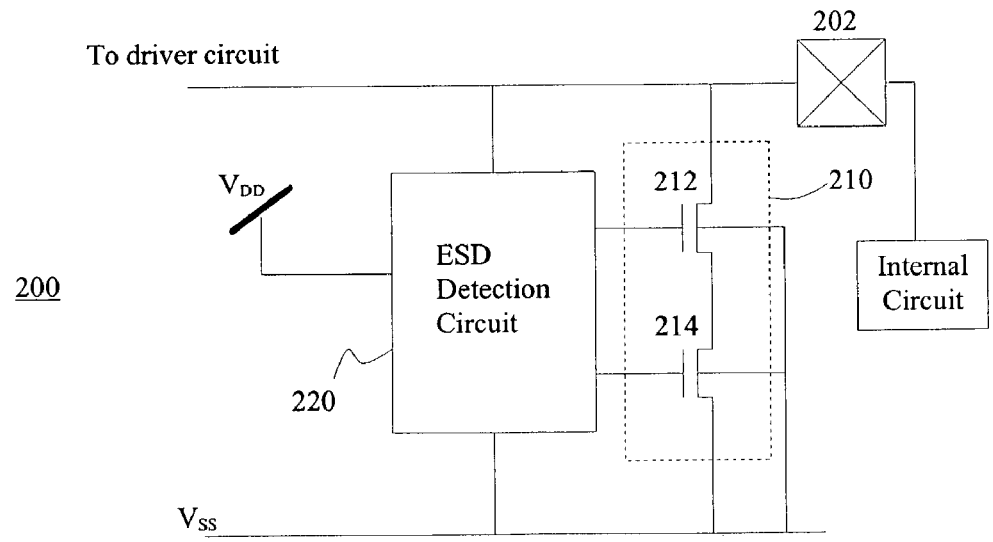
FIG. 2 is an ESD protection circuit using stacked NMOS transistors consistent with one embodiment of the present invention.

FIG. 2 is a circuit diagram of an ESD protection circuit 200. A pad, particularly an input/output (I/O) pad 202, in a mixed-voltage buffer circuit is coupled to ESD protection circuit 200 and an internal circuit (not numbered). ESD protection circuit 200 protects the buffer circuit against an ESD appearing on I/O pad 202 using stacked NMOS transistors 210.

Stacked NMOS transistors 210 form an ESD discharging circuit (not numbered) coupled to an ESD detection circuit 220. ESD detection circuit 220 is connectable to a power supply voltage $V_{DD}$ and a ground $V_{SS}$. Stacked NMOS transistors 210 include a first NMOS transistor 212 and a second NMOS transistor 214, each of NMOS transistors 212 and 214 having a source (not numbered), a drain (not numbered), a gate (not numbered), and a substrate (not numbered). The source of NMOS transistor 212 is coupled to the drain of NMOS transistor 214. The drain of NMOS transistor 212 is coupled to I/O pad 202. The source of NMOS transistor 214 is tied to $V_{SS}$. Both of the substrates of NMOS transistors 212 and 214 are tied to $V_{SS}$. ESD detection circuit 220 is connected to the gates of NMOS transistors 212 and 214.

Under normal operation conditions of the buffer circuit, i.e., non-ESD stress conditions, ESD detection circuit 220 outputs a first set of voltage signals to the gates of NMOS transistor 212 and 214 to turn off stacked NMOS transistors 210. The first set of voltage signals turn off NMOS transistors 214. Under an ESD stress condition, an ESD appears on I/O pad 202. ESD detection circuit 220 detects the ESD current and outputs a second set of voltage signals to the gates of NMOS transistors 212 and 214 to turn on stacked NMOS transistors 210 to discharge the ESD current. The second set of voltage signals may be chosen so that both NMOS transistors 212 and 214 are turned on. Since ESD detection circuit 220 outputs the signals to the gates of the NMOS transistors 212 and 214, this technique is referred to as gate-driven technique.

Figure 3:
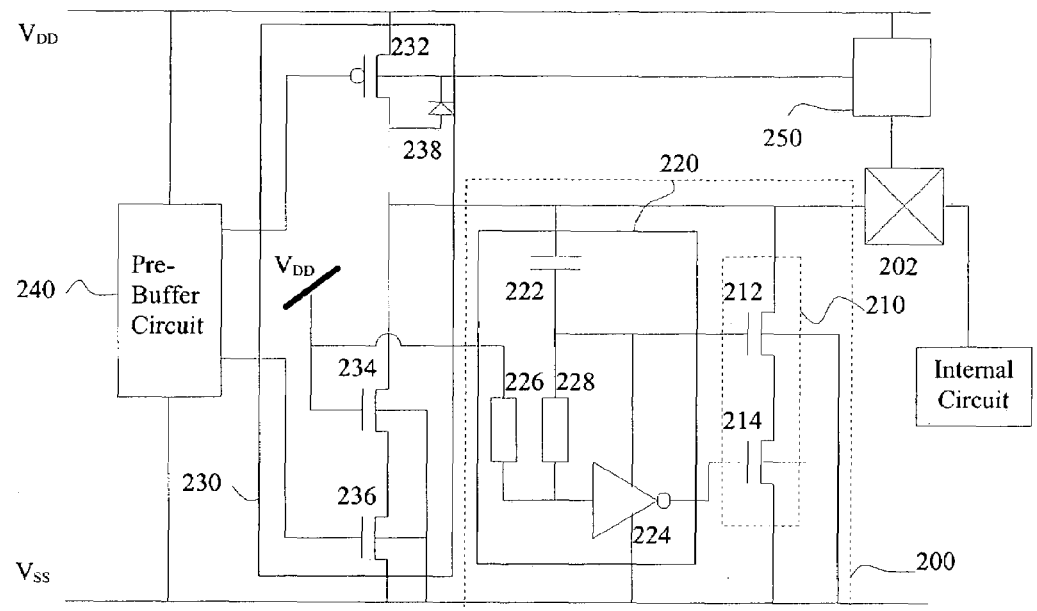
FIG. 3 is an ESD protection circuit using stacked NMOS transistors consistent with another embodiment of the present invention.

An embodiment of ESD protection circuit 200 is shown in FIG. 3. Referring to FIG. 3, a driver circuit 230 is coupled to ESD protection circuit 200 and I/O pad 202. Driver circuit 230 is driven by a pre-buffer circuit 240, and is also coupled to an n-well self-biased circuit 250.

ESD detection circuit 220 comprises a capacitor 222, an inverter 224, and resistors 226 and 228. Inverter 224 includes an input (not numbered), an output (not numbered), a power supply (not numbered), and a ground (not numbered) terminal. The input terminal is coupled to both resistors 226 and 228. The output terminal is coupled to the gate of NMOS transistor 214. The power supply terminal is coupled to capacitor 222, resistor 228, and the gate of NMOS transistor 212. The ground terminal of inverter 224 is coupled to $V_{SS}$. Resistor 226 is also coupled to $V_{DD}$ and capacitor 222 is also coupled to I/O pad 202.

Driver circuit 230 comprises a PMOS transistor 232 and stacked NMOS transistors 234 and 236. Each of transistors 232, 234, and 236 includes a substrate (not numbered), a source (not numbered), a drain (not numbered), and a gate (not numbered) terminal. PMOS transistor 232 also includes a parasitic diode 238 between its drain and substrate terminals. Pre-buffer circuit 240 is coupled to the gates of PMOS transistor 232 and NMOS transistor 236. N-well self-biased circuit 250 provides a bias signal to the substrate of PMOS transistor 232. The source of PMOS transistor 232 is coupled to $V_{DD}$. The drain of PMOS transistor 232 is coupled to the drain of NMOS transistor 234 and I/O pad 202. The substrates of both NMOS transistors 234 and 236 are coupled to $V_{SS}$. The gate of NMOS transistor 234 is coupled to $V_{DD}$. N-well self-biased circuit 250 is also coupled to I/O pad 202 and $V_{DD}$.

Under normal operation conditions, a potential on the input terminal of inverter 224 is substantially equal to that on the power supply terminal of inverter 224 because resistor 226 is coupled to $V_{DD}$. Therefore, inverter 224 outputs a voltage signal of a low level or ground level to the gate of NMOS transistor 214 to turn off NMOS transistor 214. A discharging path through stacked NMOS transistors 210 is therefore shut down.

Under an ESD stress condition, $V_{DD}$ terminal is floating. A positive ESD appears on I/O pad 202, and is coupled to the power supply terminal of inverter 224 through capacitor 222. Inverter 224 outputs a signal of a high voltage level to the gate of NMOS 214. Since the gate of NMOS transistor 212 is also coupled to the ESD and therefore biased at the voltage level of the ESD, both transistors 212 and 214 are turned on and the ESD is conducted to ground through stacked NMOS transistors 210.

Figure 4:
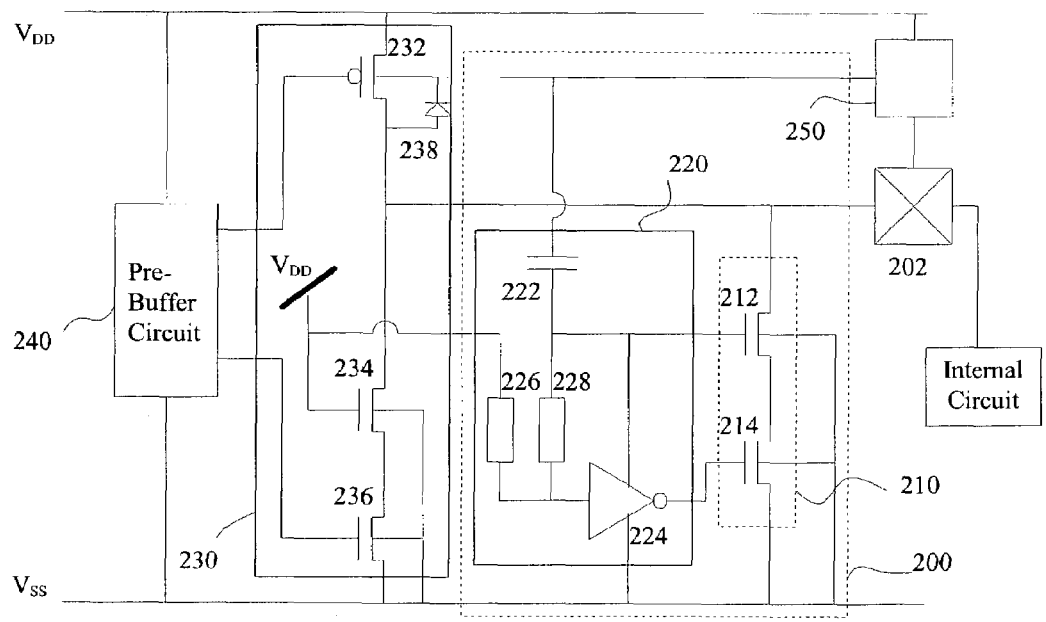
FIG. 4 is an ESD protection circuit using stacked NMOS transistors consistent with another embodiment of the present invention.

Another embodiment of ESD protection circuit 200 is shown in FIG. 4. Referring to FIG. 4, capacitor 222 is coupled to the substrate of PMOS transistor 232 instead of I/O pad 202, as shown in FIG. 3. Otherwise, the circuit shown in FIG. 4 has the same configuration as that of FIG. 3.

Under an ESD stress condition, an ESD appearing on the I/O pad is coupled to capacitor 222 through parasitic diode 238. Therefore, one skilled in the art would recognize that the minimum voltage level required to turn on ESD protection circuit 200 shown in FIG. 4, i.e., turn on the ESD discharging circuit, is higher than that required in the circuit of FIG. 3 by an amount required to overcome parasitic diode 238. Therefore, a noise margin of ESD protection circuit 200 is increased.

In addition, a parasitic capacitance for I/O pad 202 shown in FIG. 4 now only includes junction capacitances of PMOS transistor 232 and NMOS transistors 234 and 212, a decrease compared to that of FIG. 3, which includes the capacitance of capacitor 222.

In accordance with another embodiment of the present invention, a field oxide device (FOD) may be used in an ESD protection circuit.

Compared to a thin gate MOS transistor, an FOD does not have any problems with electrical overstress on a gate because it does not have a gate terminal. It can also avoid the hot carrier degradation problem associated with a thin gate MOS transistor because it has a wider channel length.

Therefore, an FOD can be used in an ESD protection circuit in place of stacked NMOS transistors.

Figure 5:
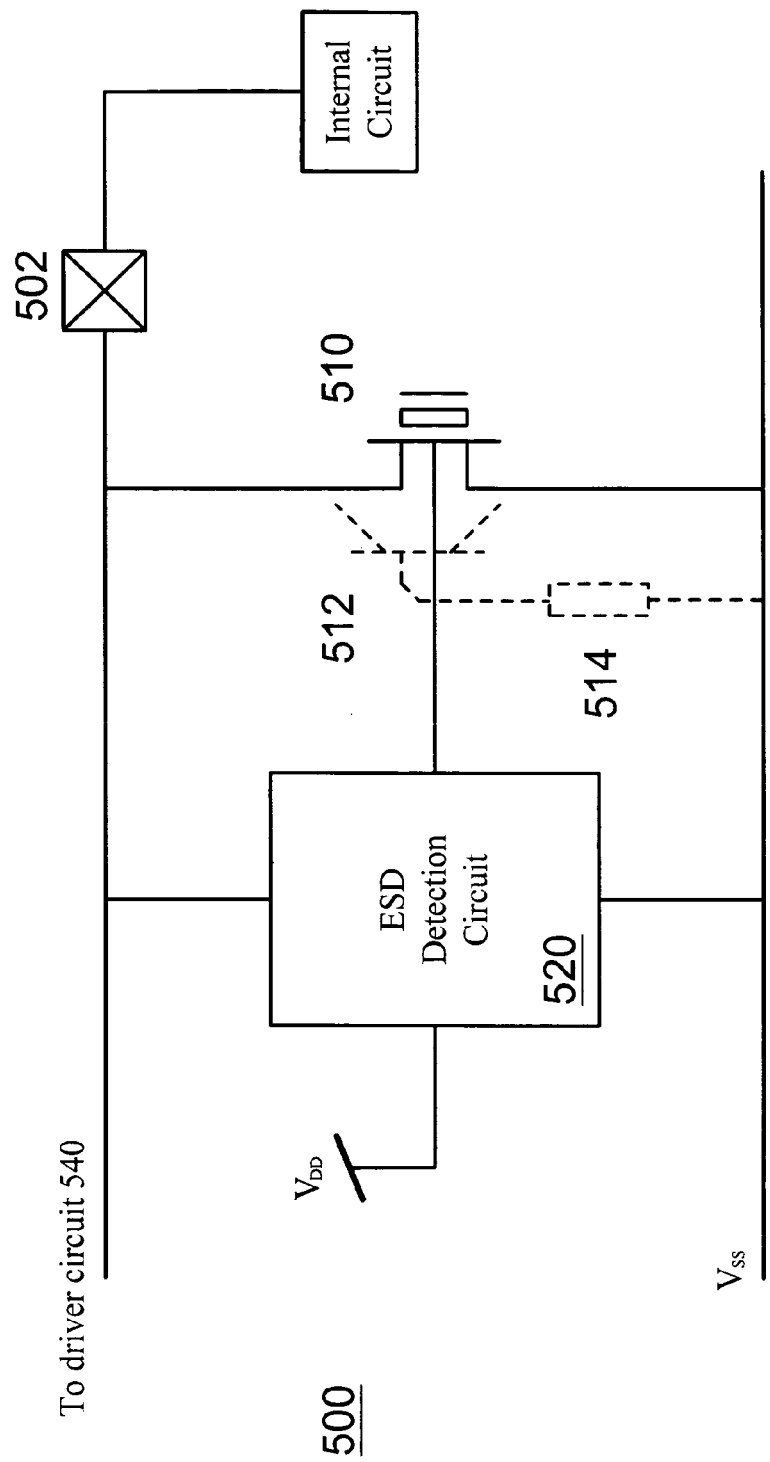
FIG. 5 is an ESD protection circuit using a field oxide device consistent with one embodiment of the present invention.

FIG. 5 shows an ESD protection circuit 500 coupled to an I/O pad (or contact pad) 502 in a mixed-voltage buffer circuit. I/O pad 502 is also coupled to an internal circuit (not numbered). ESD protection circuit 500 provides protection for the buffer circuit against an ESD event that appears on I/O pad 502 using an FOD 510.

ESD protection circuit 500 comprises an ESD discharging circuit (not numbered), which includes FOD 510 coupled to an ESD detection circuit 520. ESD detection circuit 520 detects an ESD event on I/O pad 502 and triggers the ESD discharging circuit to discharge the ESD.

FOD 510 includes a drain (not numbered) coupled to I/O pad 502, a source (not numbered) coupled to ground $V_{SS}$, and a substrate (not numbered) coupled to ESD detection circuit 520. Two parasitic diodes (not numbered) formed between the substrate and the source and between the substrate and the drain of FOD 510, respectively, are coupled back-to-back to form a parasitic lateral bipolar junction transistor (LBJT) 512. One of the source and drain forms an emitter terminal of LBJT 512 and the other of the source and drain forms a collector terminal of LBJT 512. LBJT 512 also includes a base terminal, which is the substrate of FOD 510. FOD 510 also includes a parasitic substrate resistor 514, which represents a resistance through the substrate of FOD 510 to a grounding point.

Under normal operation conditions of the IC, ESD detection circuit 520 outputs a low voltage signal to the substrate of FOD 510 and turns off LBJT 512. As a result, an ESD discharging path through FOD 510 is shut down. When ESD detection circuit 520 detects an ESD event on I/O pad 502, it outputs a signal to the substrate of FOD 510 to turn on LBJT 512 to conduct the ESD from I/O pad 502 to $V_{SS}$.

Figure 6:
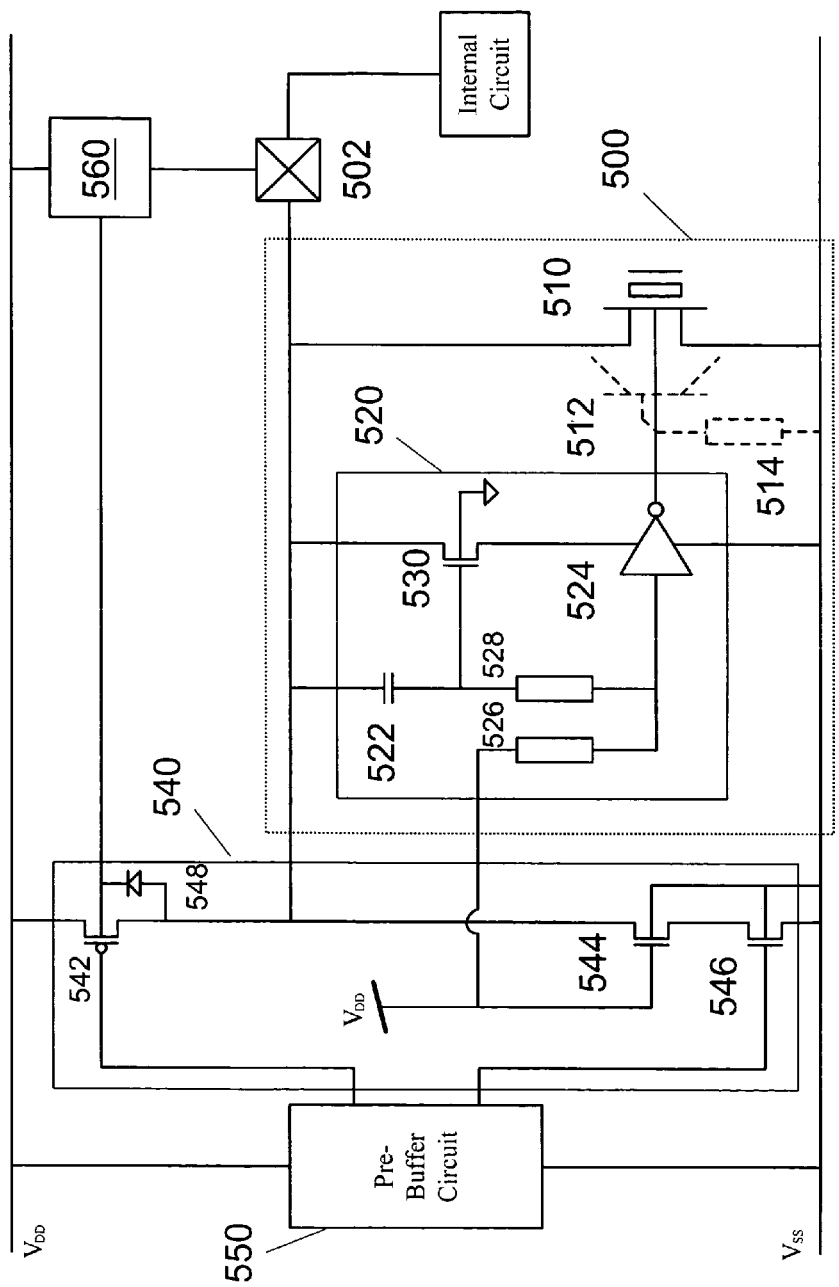
FIG. 6 is an ESD protection circuit using a field oxide device consistent with another embodiment of the present invention.

An embodiment of ESD protection circuit 500 is shown in FIG. 6. Referring to FIG. 6, a driver circuit 540 is coupled to ESD protection circuit 500 and I/O pad 502. Driver circuit 540 is driven by a pre-buffer circuit 550, and is also coupled to an n-well self-biased circuit 560.

ESD detection circuit 520 comprises a capacitor 522, an inverter 524, resistors 526 and 528, and a transistor 530. Transistor 530 includes a source (not numbered), a drain (not numbered), a gate (not numbered), and a substrate (not numbered). Inverter 524 includes four terminals: an input (not numbered), an output (not numbered), a power supply (not numbered), and a ground (not numbered). Capacitor 522 is coupled to I/O pad 502 and the gate terminal of transistor 530. The input terminal of inverter 524 is coupled to both resistors 526 and 528. The output terminal of inverter 524 is coupled to the base of LBJT 512, or the substrate of FOD 510. The ground terminal of inverter 524 is connected to $V_{SS}$. The power supply terminal of inverter 524 is coupled to the source of transistor 530. Resistor 526 is coupled to a power supply $V_{DD}$ and resistor 528 is coupled to the gate of transistor 530. The drain of transistor 530 is coupled to I/O pad 502 and the substrate of transistor 530 is connected to $V_{SS}$.

Driver circuit 540 includes a PMOS transistor 542 and stacked NMOS transistors 544 and 546. Each of transistors 542, 544 and 546 includes a substrate (not numbered), a source (not numbered), a drain (not numbered), and a gate (not numbered) terminal. PMOS transistor 542 also includes a parasitic diode 548 formed between its drain and substrate terminals. Pre-buffer circuit 550 is coupled to the gates of PMOS transistor 542 and NMOS transistor 546. N-well self-biased circuit 560 provides a bias to the substrate of PMOS transistor 542. The source of PMOS transistor 542 is connectable to $V_{DD}$. The drain of PMOS transistor 542 is coupled to the drain of NMOS transistor 544 and further coupled to I/O pad 502. The substrates of both NMOS transistors 544 and 546 are coupled to $V_{SS}$. The gate of NMOS transistor 544 is coupled to $V_{DD}$. N-well self-biased circuit 560 is also coupled to I/O pad 502 and $V_{DD}$.

Under normal operation conditions, the gate of transistor 530 is biased at around $V_{DD}$, and the voltage level at the power supply terminal of inverter 524 is approximately $V_{DD}$-$V_{th530}$, wherein $V_{th530}$ is the threshold voltage of transistor 530. It follows that inverter 524 outputs a low voltage signal to the base of LBJT 512, or the substrate of FOD 510, to turn off LBJT 512. There is no current passing through the substrate of FOD 510 and the discharging circuit is off.

Under an ESD stress condition, $V_{DD}$ terminal is floating. A positive ESD appears on I/O pad 502 and is coupled to the gate of transistor 530 through capacitor 522 to turn on transistor 530. Inverter 524 is thus powered at the voltage level of the ESD less the threshold voltage of transistor 530. As a result, inverter 524 outputs a substrate-triggered current to the substrate of FOD 510 to turn on LBJT 512. When LBJT 512 is turned on, the ESD is conducted to $V_{SS}$ through FOD 510. Therefore, this technique is often referred to as substrate-triggered technique.

Figure 7:
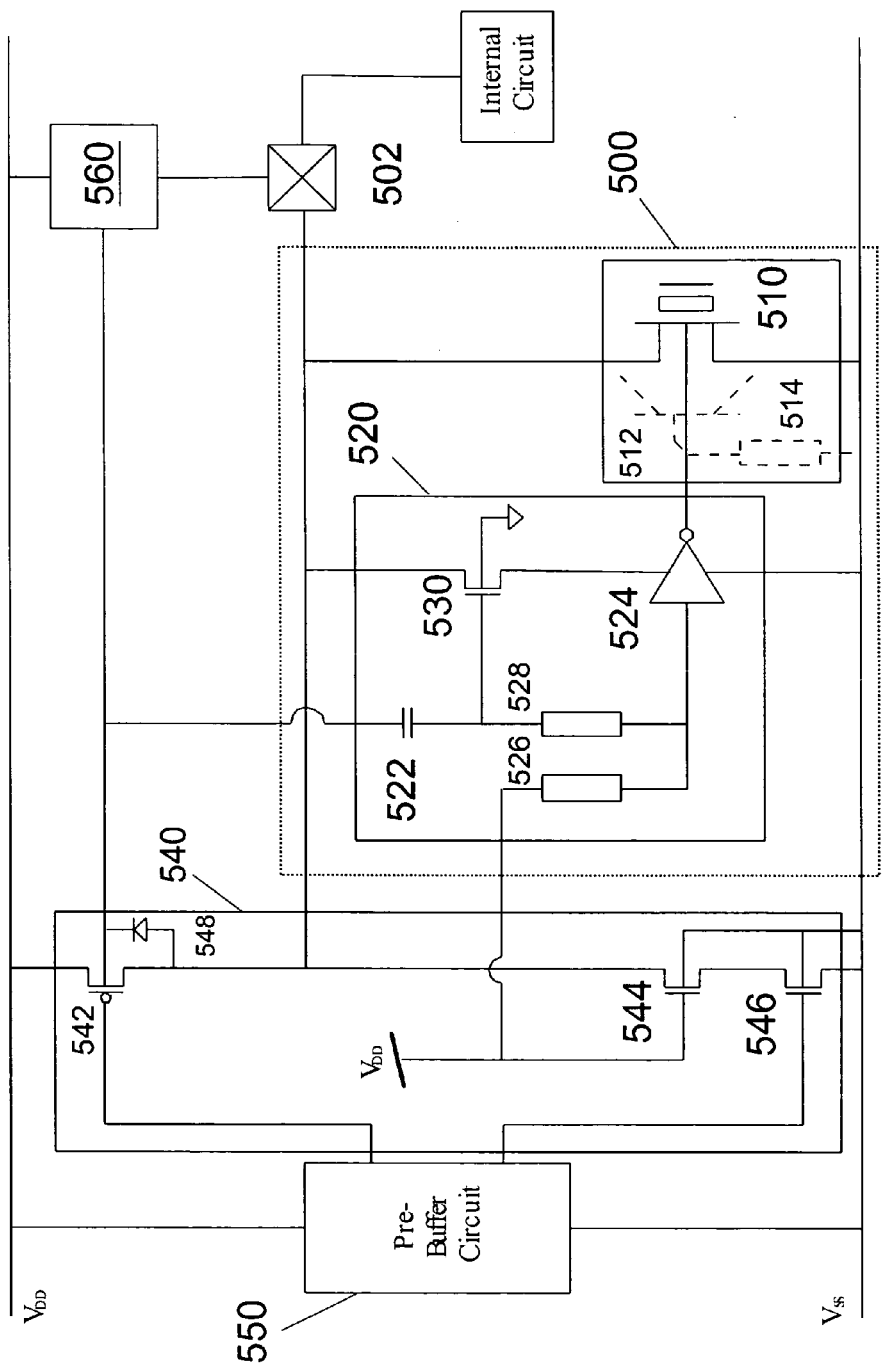
FIG. 7 is an ESD protection circuit using a field oxide device consistent with another embodiment of the present invention.

Another embodiment of ESD protection circuit 500 is shown in FIG. 7. Compared to the circuit shown in FIG. 6, capacitor 522 is coupled to the substrate of PMOS 542, instead of I/O pad 502, to improve a noise margin of ESD protection circuit 500 and also to reduce the parasitic capacitance of I/O pad 502.

Figure 8:
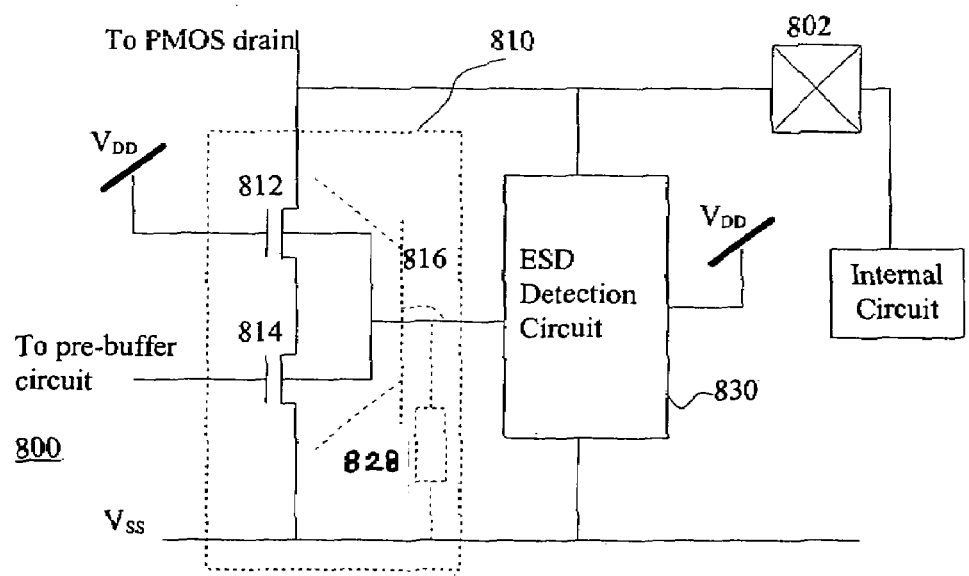
FIG. 8 is an ESD protection circuit using stacked NMOS transistors consistent with one embodiment of the present invention.

FIG. 8 shows an ESD protection circuit 800 consistent with another embodiment of the present invention. An I/O pad (or contact pad) 802 of a mixed-voltage buffer circuit is coupled to an internal circuit (not numbered). ESD protection circuit 800 protects the buffer circuit against an ESD event that appears on I/O pad 802.

A driver circuit 810 is coupled to a pre-buffer circuit (not shown) and I/O pad 802. Driver circuit 810 comprises a pair of stacked NMOS transistors 812 and 814, each of which includes a gate (not numbered), a drain (not numbered), a source (not numbered), and a substrate (not numbered). Stacked NMOS transistors 812 and 814 together form a parasitic LBJT 816. The substrates of NMOS transistors 812 and 814 are coupled together to form a base of LBJT 816. One of the source of NMOS transistor 814 and the drain of NMOS transistor 812 forms an emitter and the other forms a collector of LBJT 816. The gate of NMOS transistor 812 is connectable to a power supply $V_{DD}$ and the gate of NMOS transistor 814 is coupled to a pre-buffer circuit (not shown). The source of NMOS transistor 814 is coupled to ground $V_{SS}$ and the drain of NMOS transistor 814 is coupled to the source of NMOS transistor 812. The drain of NMOS transistor 812 is further coupled to I/O pad 802. Similarly, a parasitic substrate resistor 828 is also shown in FIG. 8. Driver circuit 810 also provides an ESD protection for I/O pad 802.

An ESD detection circuit 830 coupled to I/O pad 802 and driver circuit 810 detects an ESD event on I/O pad 802 and provides a signal to driver circuit 810 to improve ESD protection provided by driver circuit 810. As shown in FIG. 8, ESD detection circuit 830 is coupled to the substrates of NMOS transistors 812 and 814.

Under normal operation conditions, ESD detection circuit 830 outputs a low voltage signal to the substrates of NMOS transistors 812 and 814, which turns off LBJT 816 and shuts down an ESD discharging path through LBJT 816.

When ESD detection circuit 830 detects an ESD on I/O pad 802, it outputs a substrate-triggered current signal to the substrates of NMOS transistors 812 and 814 to turn on LBJT 816 to conduct the ESD to $V_{SS}$.

Figure 9:
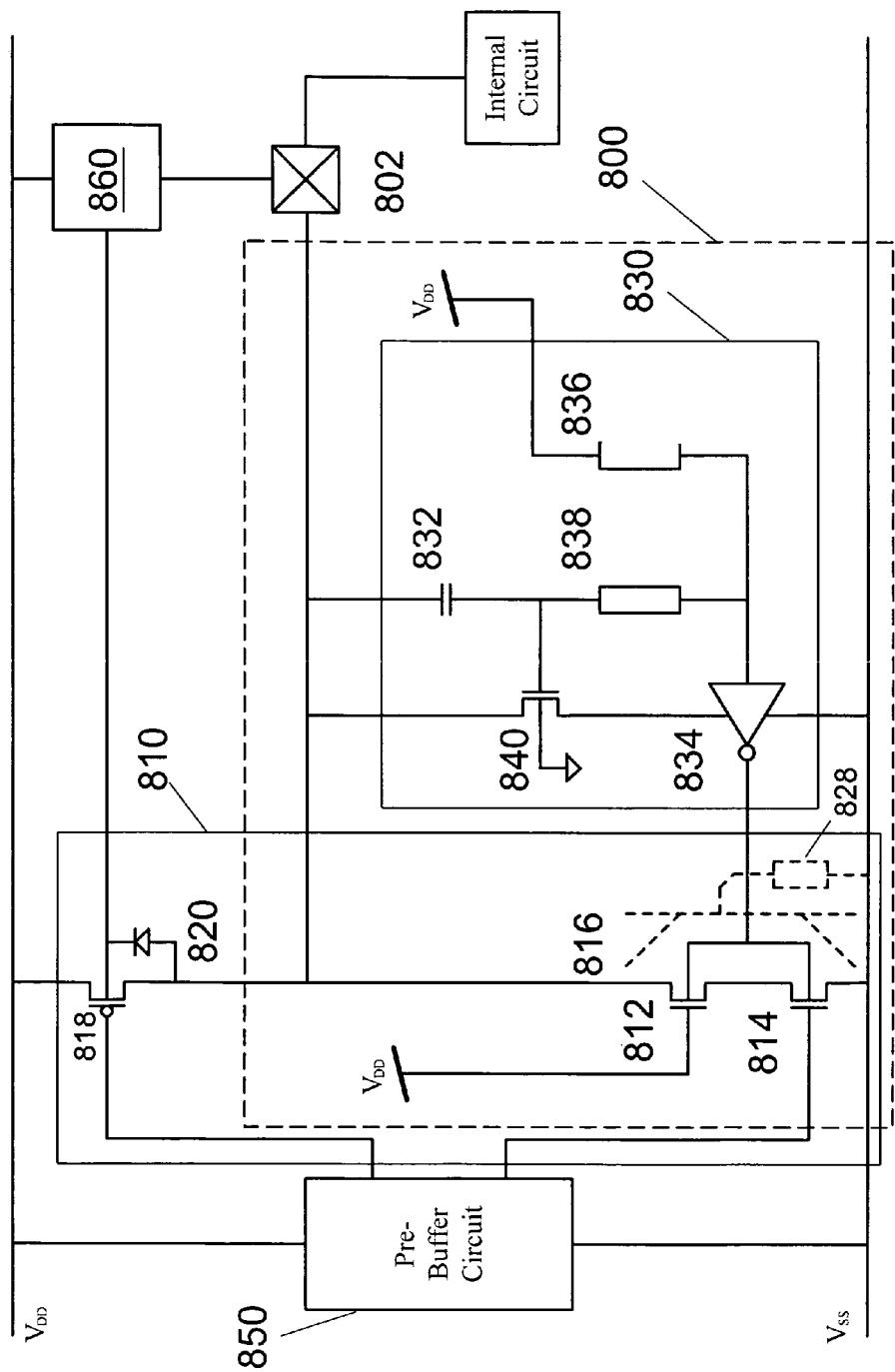
FIG. 9 is an ESD protection circuit using stacked NMOS transistors consistent with another embodiment of the present invention.

An embodiment of circuit 800 is shown in FIG. 9. Referring to FIG. 9, driver circuit 810 further comprises a PMOS transistor 818. PMOS transistor 818 includes a drain (not numbered), a substrate (not numbered), a source (not numbered), and a gate (not numbered). PMOS transistor 818 also includes a parasitic diode 820 formed between its drain and substrate. The source of PMOS transistor 818 is connectable to $V_{DD}$. The drain of PMOS transistor 818 is coupled to I/O pad 802 and the drain of NMOS transistor 812. The gate of PMOS transistor 818 is driven by a pre-buffer circuit 850. An n-well self-biased circuit 860 is coupled to the substrate of PMOS transistor 818 and I/O pad 802. N-well self-biased circuit 860 is also connectable to $V_{DD}$.

ESD detection circuit 830 includes a capacitor 832, an inverter 834, resistors 836 and 838, and an NMOS transistor 840. Inverter 834 includes an input terminal (not numbered), an output terminal (not numbered), a power supply terminal (not numbered), and a ground terminal (not numbered). Transistor 840 includes a gate (not numbered), a source (not numbered), a drain (not numbered), and a substrate (not numbered). Capacitor 832 is coupled to I/O pad 802. The input terminal of inverter 834 is coupled to both resistors 836 and 838. The output terminal of inverter 834 is coupled to the substrates of transistors 812 and 814. The power supply terminal of inverter 834 is coupled to the source of NMOS transistor 840. The gate of transistor 840 is coupled to capacitor 832 and resistor 838. The drain of transistor 840 is coupled to I/O pad 802.

Under normal operation conditions, the gate of transistor 840 is biased at around $V_{DD}$, and the voltage level at the power supply terminal of inverter 834 is approximately $V_{DD}-V_{th840}$, wherein $V_{th840}$ is the threshold voltage of transistor 840. It follows that inverter 834 outputs a low voltage signal to the base of LBJT 816, or the substrates of NMOS transistors 812 and 814, to turn off LBJT 816.

When an ESD appears on I/O pad 802, the ESD is coupled to the gate of transistor 840 through capacitor 832. Inverter 834 is thus powered at the voltage level of the ESD less the threshold voltage of transistor 840, and outputs a positive voltage to the base of LBJT 816 to turn on LBJT 816. When LBJT 816 is turned on, a substrate current through the substrates of NMOS transistors 812 and 814 discharges the ESD to $V_{SS}$.

Figure 10:
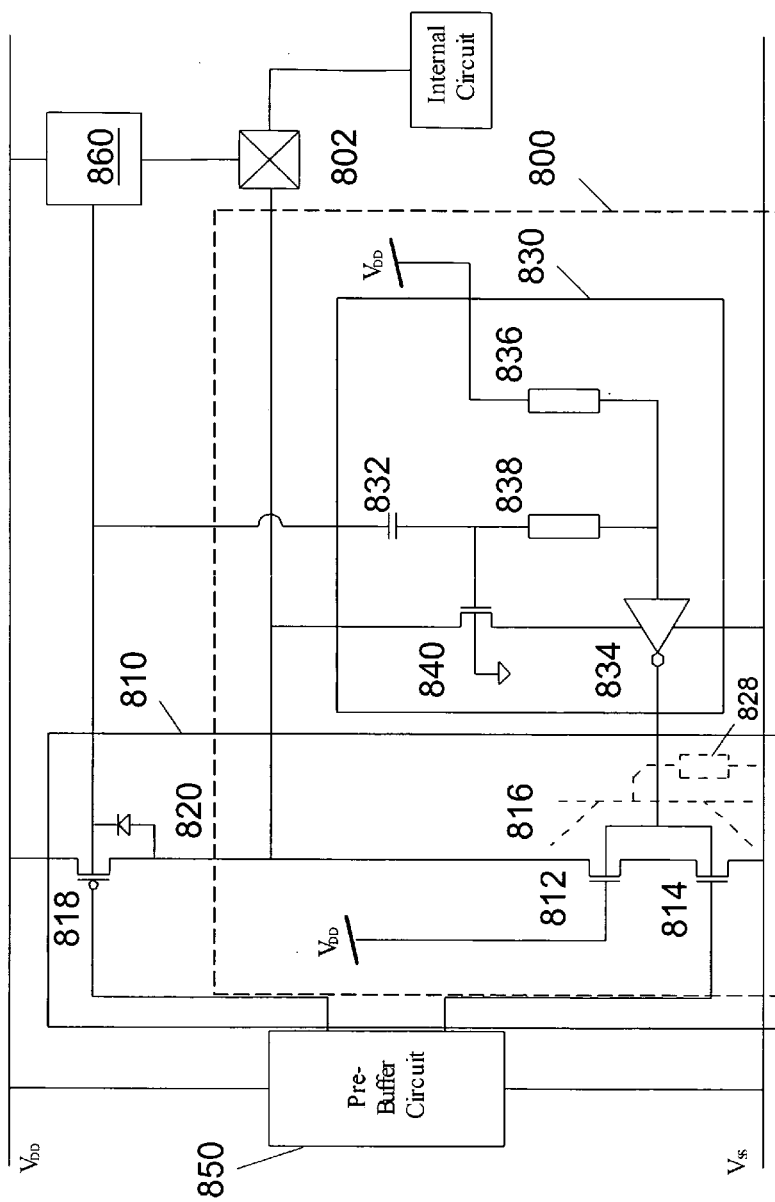
FIG. 10 is an ESD protection circuit using stacked NMOS transistors consistent with another embodiment of the present invention.

Clearly, by using the same circuit for both the driver circuit and discharging circuit, the chip layout area is greatly reduced. In addition, capacitor 832 may be coupled to the substrate of PMOS transistor 818 to improve a noise margin of ESD protection circuit 800 and decrease a parasitic capacitance of I/O pad 802, as shown in FIG. 10.

Figure 11:
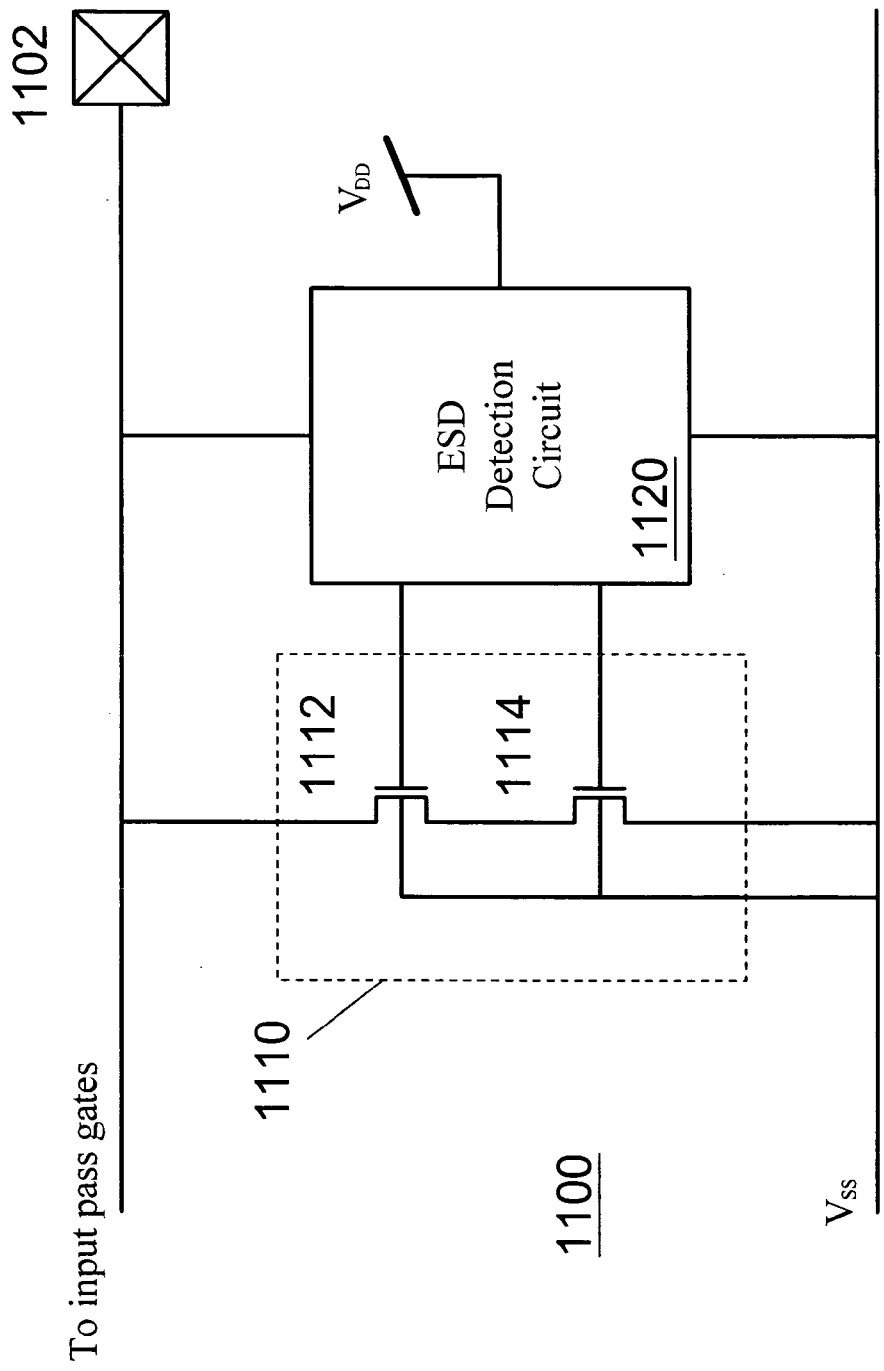
FIG. 11 is an ESD protection circuit using stacked NMOS transistors consistent with one embodiment of the present invention.

Some IC's may include one or more input pads (input pins) that tolerate voltages higher than a normal operation voltage of the circuit. Such input pads are called high-voltage-tolerant input pads. In accordance with the present invention, an ESD protection circuit is also provided for an IC against an ESD appearing on a high-voltage-tolerant input pad. FIG. 11 shows a diagram of an ESD protection circuit 1100 that provides ESD protection to an IC (not shown) having a high-voltage-tolerant input pad 1102. ESD protection circuit 1100 is coupled to input pad 1102 and ground, or $V_{SS}$, and includes a discharging circuit 1110 and an ESD detection circuit 1120. Discharging circuit 1110 comprises stacked NMOS transistors 1112 and 1114. Each of transistors 1112 and 1114 includes a gate (not numbered), a source (not numbered), a drain (not numbered), and a substrate (not numbered). ESD detection circuit 1120 detects an ESD on input pad 1102 and provides triggered signals to NMOS transistors 1112 and 1114 to trigger discharging circuit 1110 to conduct the ESD to $V_{SS}$.

Figure 12:
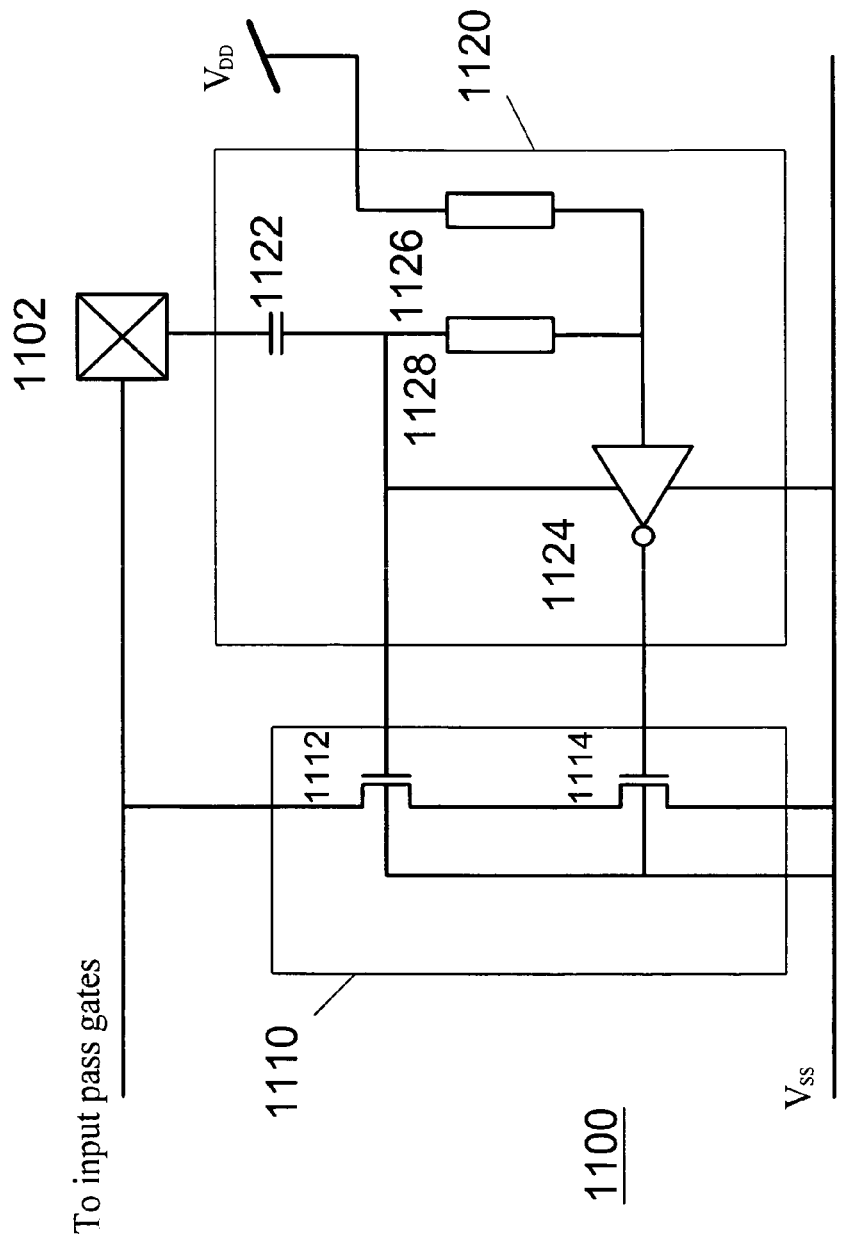
FIG. 12 is an ESD protection circuit using stacked NMOS transistors consistent with another embodiment of the present invention.

FIG. 12 shows an embodiment of ESD protection circuit 1100. Detection circuit 1120 comprises a capacitor 1122, an inverter 1124, and resistors 1126 and 1128. Inverter 1124 includes an input terminal (not numbered), an output terminal (not numbered), a power supply terminal (not numbered), and a ground terminal (not numbered). Capacitor 1122 is coupled to input pad 1102, resistor 1128, the gate of NMOS transistor 1112, and the power supply terminal of inverter 1124. The input terminal of inverter 1124 is coupled to both resistors 1126 and 1128. The output terminal of inverter 1124 is coupled to the gate of NMOS transistor 1114. The ground terminal of inverter 1124 is coupled to $V_{SS}$. Resistor 1126 is also coupled to $V_{DD}$.

Similarly, under normal operation conditions, inverter 1124 outputs a voltage signal of a low level or ground level to the gate of NMOS transistor 1114 to turn off NMOS transistor 1114. Discharging circuit 1110 is therefore turned off.

When an ESD appears on input pad 1102, inverter 1124 outputs a voltage signal of a high level to the gate of NMOS transistor 1114 to turn on NMOS transistor 1114. Therefore, discharging circuit 1110 is turned on to conduct the ESD to ground.

Figure 13:
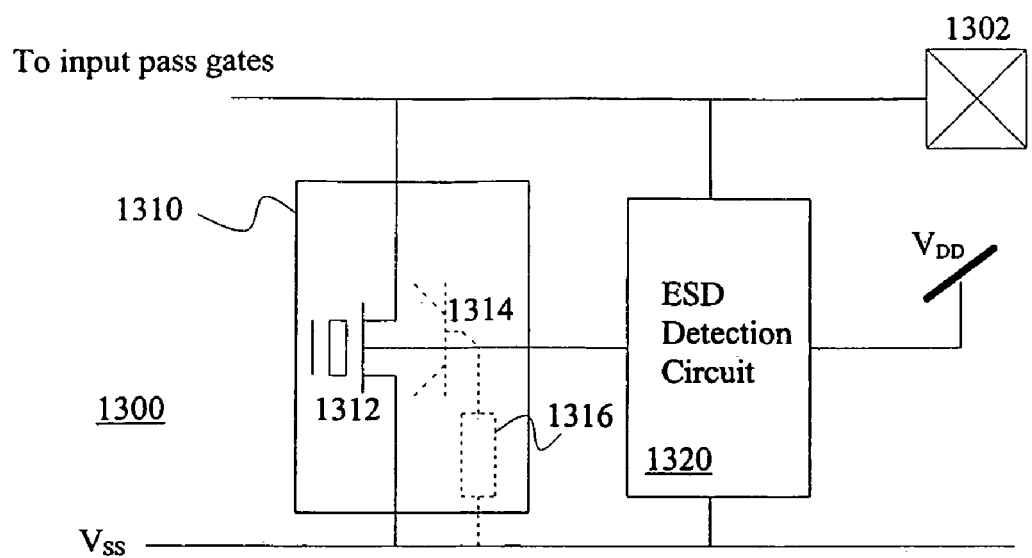
FIG. 13 is an ESD protection circuit using a field oxide device consistent with one embodiment of the present invention.
Figure 14:
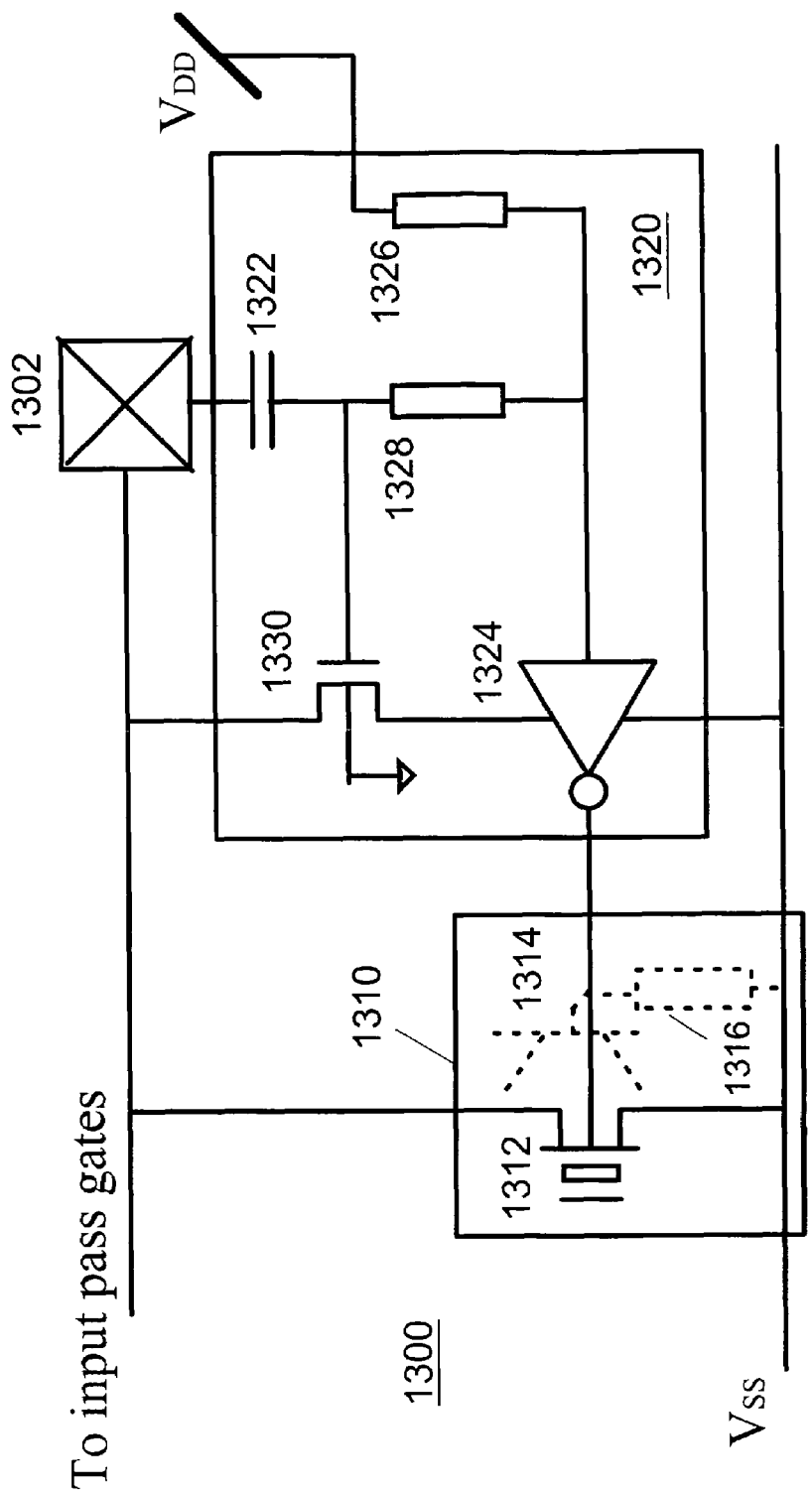
FIG. 14 is an ESD protection circuit using a field oxide device consistent with another embodiment of the present invention.

In FIGS. 13 and 14, an FOD 1312 is used to provide ESD protection for an IC (not shown) having a high-voltage-tolerant input pad 1302 using the substrate-triggered technique. Referring to FIG. 13, input pad 1302 is coupled to a discharging circuit 1310 and an ESD detection circuit 1320. Discharging circuit 1310 comprises FOD 1312 having a substrate. FOD 1312 is coupled between input pad 1302 and ground. ESD detection circuit 1320 is coupled between input pad 1302 and ground, and provides a control signal to the substrate of FOD 1312. A parasitic LBJT 1314 is formed in FOD 1312. FOD 1312 also includes a parasitic substrate resistor 1316.

Referring to FIG. 14, ESD detection circuit 1320 comprises a capacitor 1322, an inverter 1324, resistors 1326 and 1328, and an NMOS transistor 1330. The connections among these elements of ESD detection circuit 1320 are the same as those of ESD detection circuit 520 shown in FIG. 6.

Figure 15:
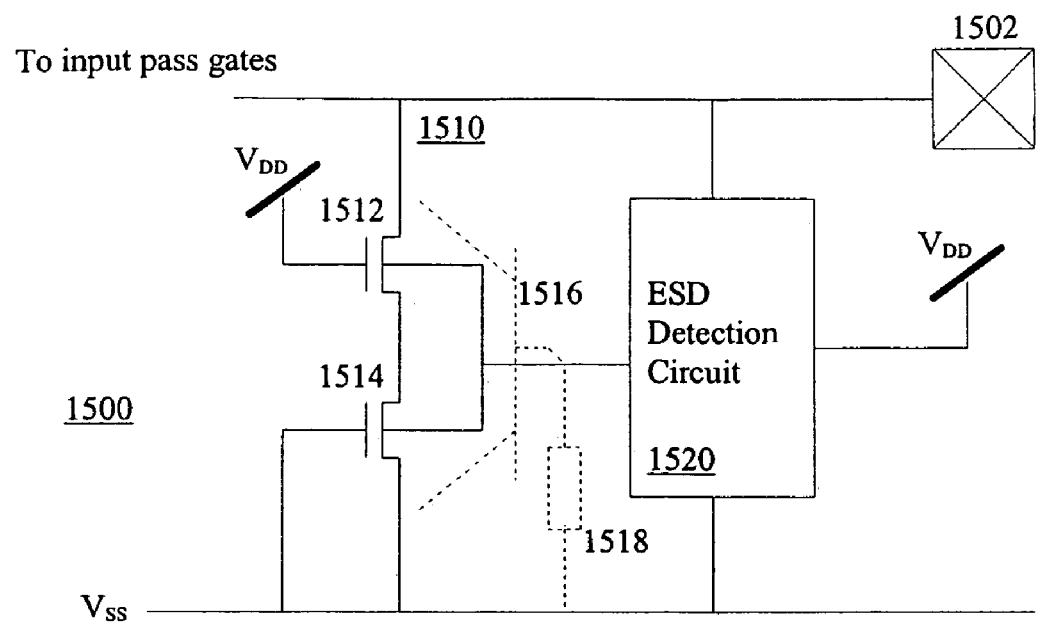
FIG. 15 is an ESD protection circuit using stacked NMOS transistors consistent with one embodiment of the present invention.
Figure 16:
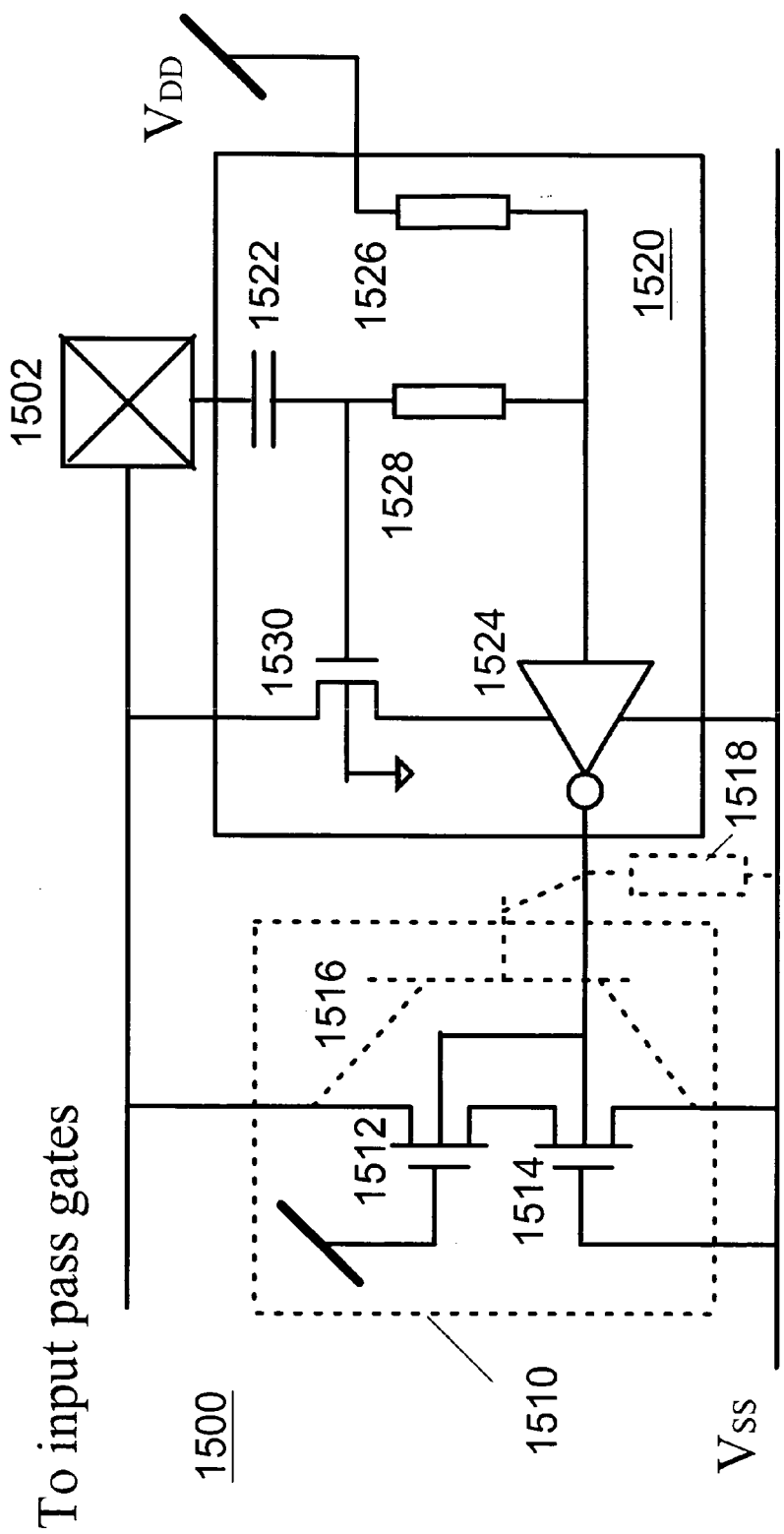
FIG. 16 is an ESD protection circuit using stacked NMOS transistors consistent with another embodiment of the present invention.

In FIGS. 15 and 16, the substrate-triggered technique is used with stacked NMOS transistors in an ESD protection circuit for a high-voltage-tolerant input pad. Referring to FIG. 15, a discharging circuit 1510 comprises a pair of stacked NMOS transistors 1512 and 1514, each having a substrate, a parasitic LBJT 1516. Stacked NMOS transistors 1512 and 1514 also include a parasitic substrate resistor 1518. An ESD detection circuit 1520 detects an ESD on input pad 1502 and provides one or more signals to the substrates of NMOS transistors 1512 and 1514. NMOS transistors 1512 and 1514 have gate biases Of $V_{DD}$ and $V_{SS}$, respectively. Therefore, NMOS transistor 1514 is off under normal operation conditions.

Referring to FIG. 16, ESD detection circuit 1520 has the same configuration as that of ESD detection circuit 830 shown in FIG. 9.

The operations of the circuits shown in FIGS. 13-16 are similar to those already described in detail. One skilled in the art would understand the operations thereof and therefore they will not be explained herein.

Although it has been assumed that the ESD event is in PS mode, the circuits shown in FIGS. 11-16 are also capable of providing protection against an NS mode ESD event. For example, when an ESD of NS mode appears on I/O pad 1302 of circuit 1300, parasitic resistor 1316 and a parasitic diode (not shown) between the substrate and drain of FOD 1312 together conduct the ESD to $V_{SS}$.

According to the present invention, there are also provided ESD protection mechanisms that protect a circuit against an ESD in any one of PS, NS, PD, ND modes.

Figure 17:
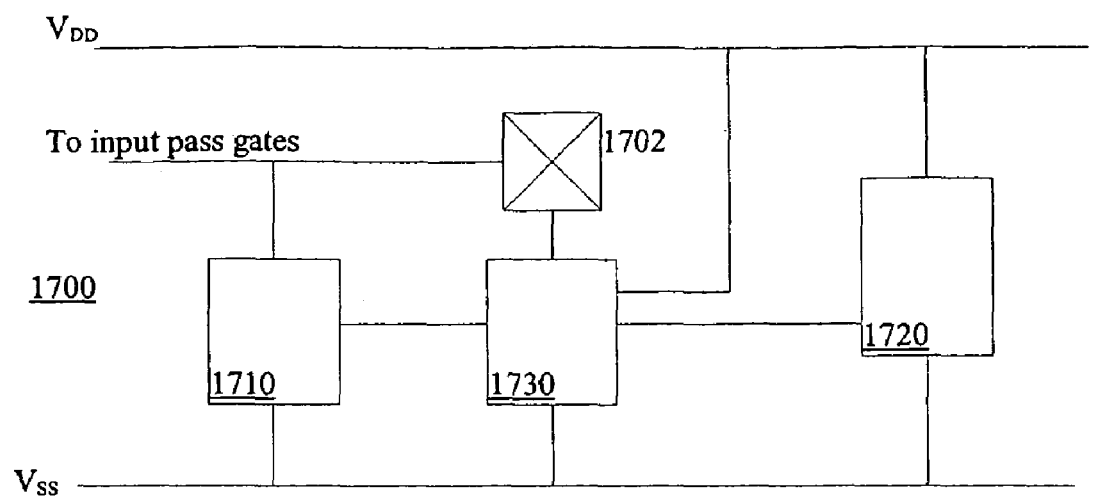
FIG. 17 is an ESD protection circuit providing protection against an ESD in any of PS, NS, PD and ND modes consistent with one embodiment of the present invention.

FIG. 17 is a diagram of an ESD protection circuit 1700 for a high-voltage-tolerant input pad 1702, which is capable of handling all four modes of ESD. ESD protection circuit 1700 includes a Pad-$V_{SS}$ clamping circuit 1710 coupled to input pad 1702. Clamping circuit 1710 corresponds in functionality to the discharging circuits shown and described in FIGS. 11-16. A $V_{DD}$-$V_{SS}$ clamping circuit 1720 provides an ESD discharging path between a power supply line $V_{DD}$ and a ground line $V_{SS}$. An ESD detection circuit 1730 detects an ESD and provides control signals to trigger clamping circuits 1710 and 1720 to discharge the ESD.

When an ESD appears on input pad 1702, Pad-$V_{SS}$ clamping circuit 1710 discharges the ESD to $V_{SS}$. If the ESD is in PD or ND mode, ESD detection circuit 1730 provides a signal to trigger $V_{DD}$-$V_{SS}$ clamping circuit 1720 to further conduct the ESD from $V_{SS}$ to $V_{DD}$. Both clamping circuits 1710 and 1720 are turned off under normal operation conditions.

Figure 18:
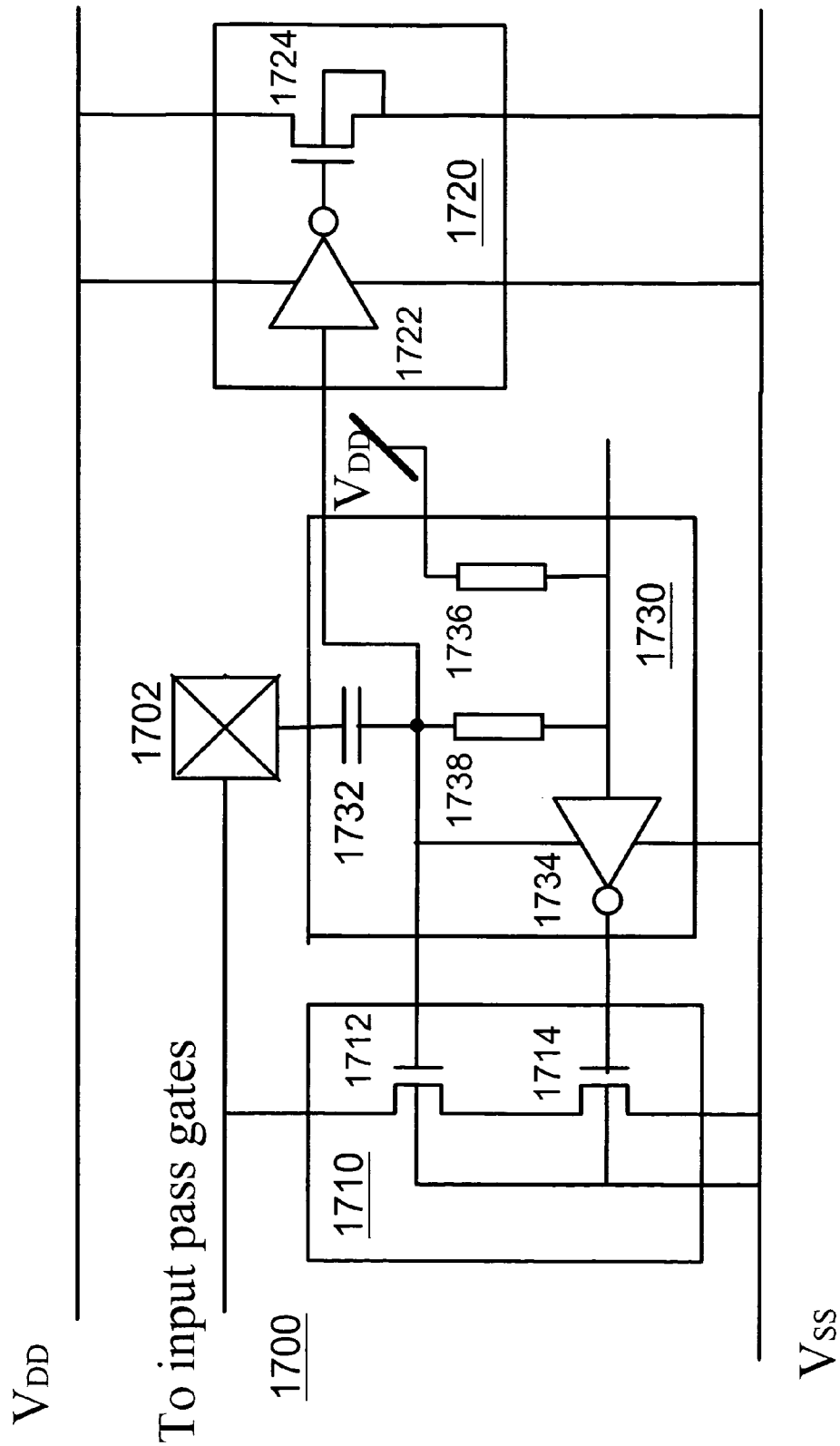
FIG. 18 is an ESD protection circuit providing protection against an ESD in any of PS, NS, PD and ND modes consistent with another embodiment of the present invention.

FIG. 18 shows an embodiment of ESD protection circuit 1700 using the gate-driven technique. Pad-$V_{SS}$ clamping circuit 1710 comprises stacked NMOS transistors 1712 and 1714. $V_{DD}$-$V_{SS}$ clamping circuit 1720 comprises an inverter 1722 and an NMOS transistor 1724. ESD detection circuit 1730 comprises a capacitor 1732, an inverter 1734, and resistors 1736 and 1738.

Each of transistors 1712, 1714 and 1724 includes a gate (not numbered), a drain (not numbered), a source (not numbered), and a substrate (not numbered) terminal. Each of inverters 1722 and 1734 includes an input terminal (not numbered), an output terminal (not numbered), a power supply terminal (not numbered), and a ground terminal (not numbered).

NMOS transistors 1712 and 1714 are serially coupled together. The drain of NMOS transistor 1712 is coupled to input pad 1702. The source of NMOS transistor 1714 is coupled to $V_{SS}$. The substrates of NMOS transistors 1712 and 1714 are both coupled to $V_{SS}$. The gate of NMOS transistor 1712 is coupled to the input terminal of inverter 1722, capacitor 1732, the power supply terminal of inverter 1734, and resistor 1738. The gate of NMOS transistor 1714 is coupled to the output terminal of inverter 1734. The output terminal of inverter 1722 is coupled to the gate of NMOS transistor 1724. The power supply terminal of inverter 1722 is coupled to $V_{DD}$. The ground terminal of inverter 1722 is coupled to $V_{SS}$. The source and the substrate of NMOS transistor 1724 are coupled together and further coupled to $V_{SS}$. The drain of NMOS transistor 1724 is coupled to $V_{DD}$. Capacitor 1732 is coupled to input pad 1702. The input terminal of inverter 1734 is coupled to both resistors 1736 and 1738. The ground terminal of inverter 1734 is coupled to $V_{SS}$. Resistor 1736 is also coupled to $V_{DD}$.

Under normal operation conditions, both Pad-$V_{ss}$ clamping circuit 1710 and $V_{DD}$-$V_{SS}$ clamping circuit 1720 are turned off, because inverters 1722 and 1734 output low voltage or ground level signals to NMOS transistors 1724 and 1714, thereby turning off NMOS transistors 1724 and 1714, respectively.

When an ESD in either PS or NS mode appears on input pad 1702, Pad-$V_{SS}$ clamping circuit 1710 discharges the ESD to $V_{SS}$ as discussed above. If the ESD is in PD or ND mode, Pad-$V_{SS}$ clamping circuit 1710 also discharges the ESD to $V_{SS}$. Moreover, when the ESD is in PD mode, a parasitic junction diode (not numbered) between the substrate and the drain of NMOS transistor 1724 will be positively biased and turned on to further discharge the ESD to from $V_{SS}$ to $V_{DD}$. If the ESD is in ND mode, an input to the input terminal of inverter 1722 has the same voltage level as that of the ESD. Therefore, inverter 1722 outputs a high voltage level to the gate of NMOS transistor 1724. NMOS transistor 1724 is turned on to discharge the negative ESD current from $V_{SS}$ to $V_{DD}$. Therefore, a discharging path exists between input pad 1702 and $V_{DD}$ for an ESD in either PD or ND mode.

Figure 19:
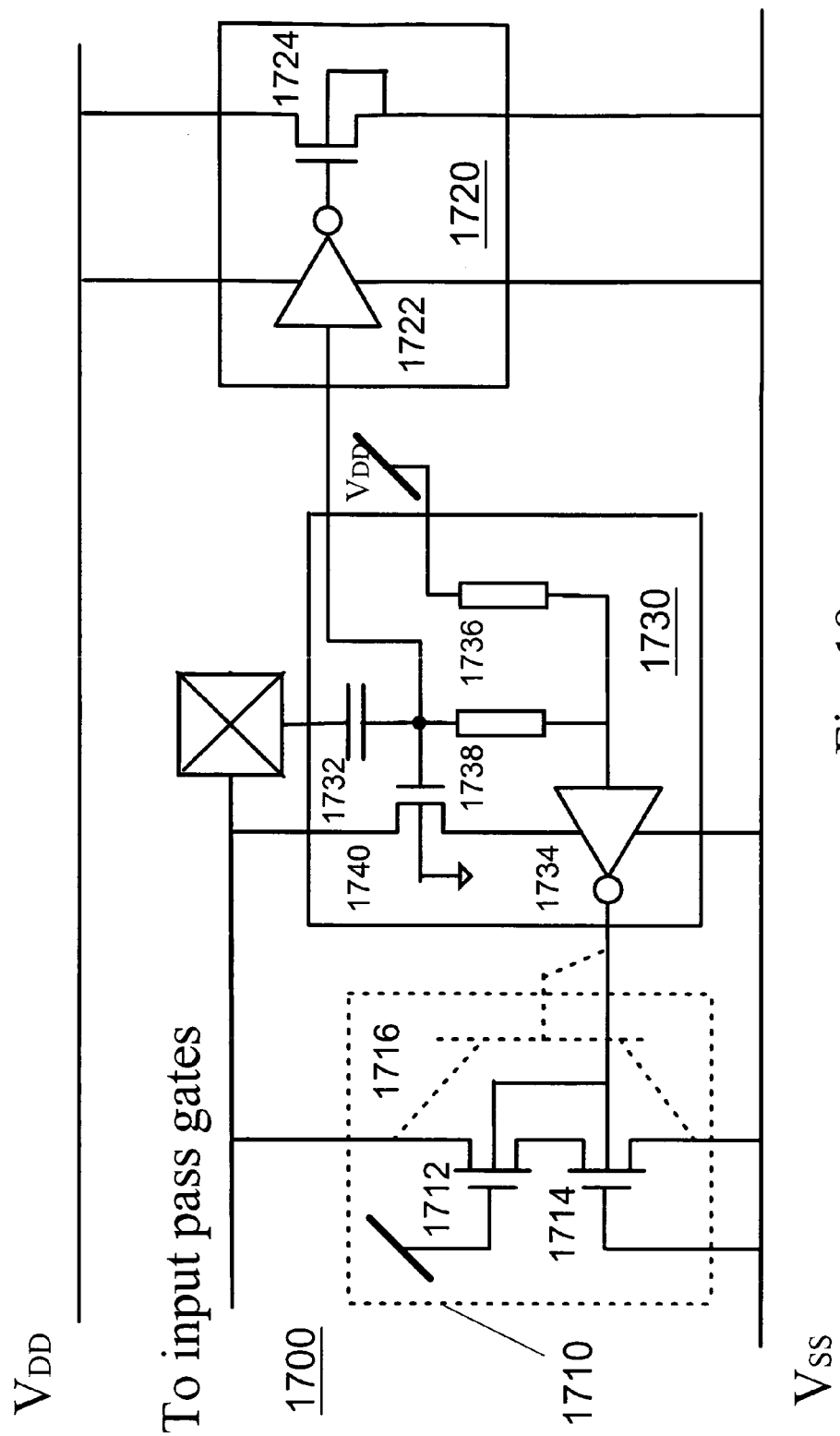
FIG. 19 is an ESD protection circuit providing protection against an ESD in any of PS, NS, PD and ND modes consistent with another embodiment of the present invention.
Figure 20:
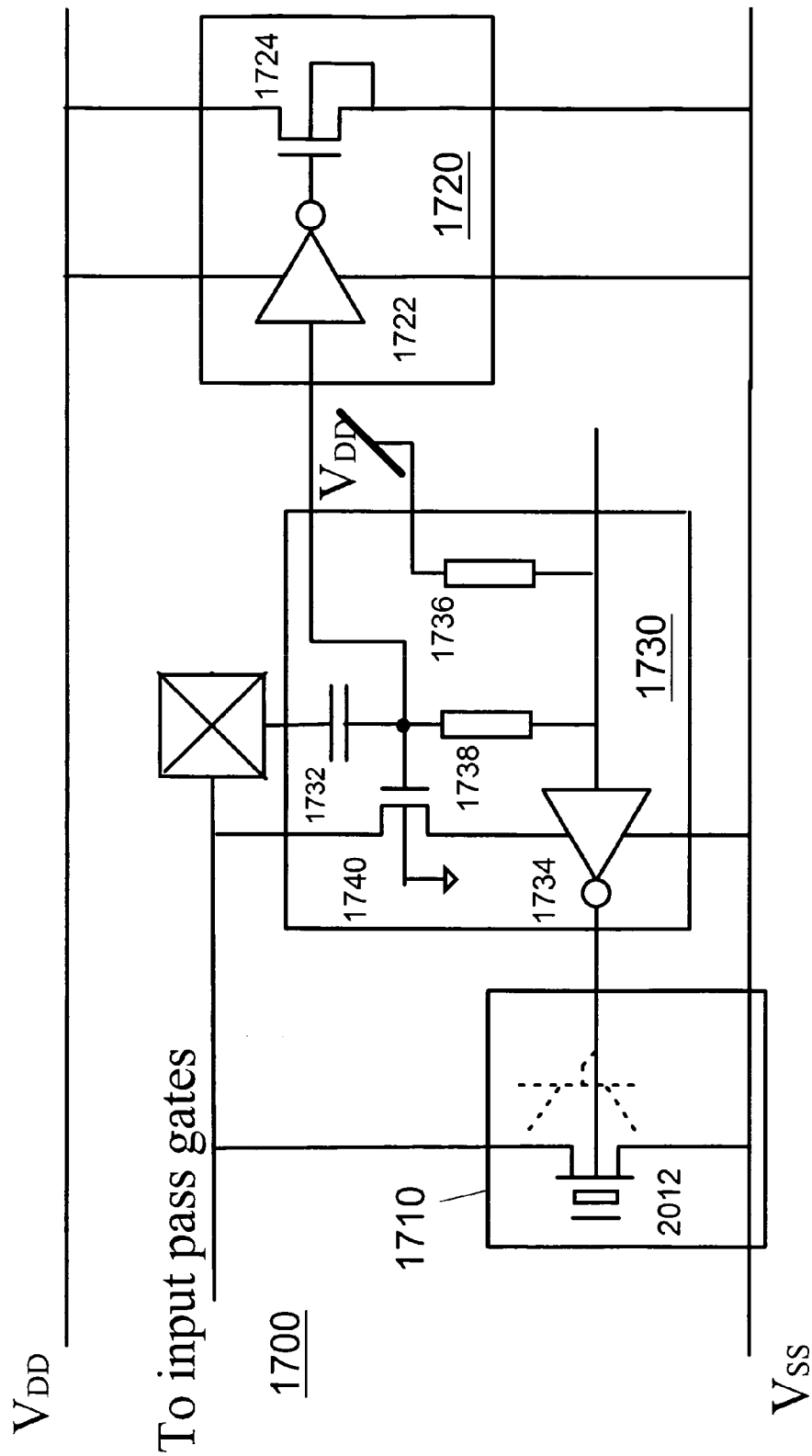
FIG. 20 is an ESD protection circuit providing protection against an ESD in any of PS, NS, PD and ND modes consistent with another embodiment of the present invention.

FIG. 19 is an embodiment of ESD protection circuit 1700 using a pair of stacked NMOS transistors and the substrate-triggered technique for ESD protection in any of the four modes. FIG. 20 is another embodiment of ESD protection circuit 1700 incorporating an FOD and the substrate-triggered technique.

The operations of the circuits shown in FIGS. 19 and 20 are similar to those already described in detail. One skilled in the art would understand the operations thereof and therefore they will not be explained herein.

Further according to the present invention, there are provided mechanisms to protect multiple I/O buffers and/or input pads against ESD in any of the four modes, by using only a single $V_{DD}$-$V_{SS}$ clamping circuit.

Figure 21:
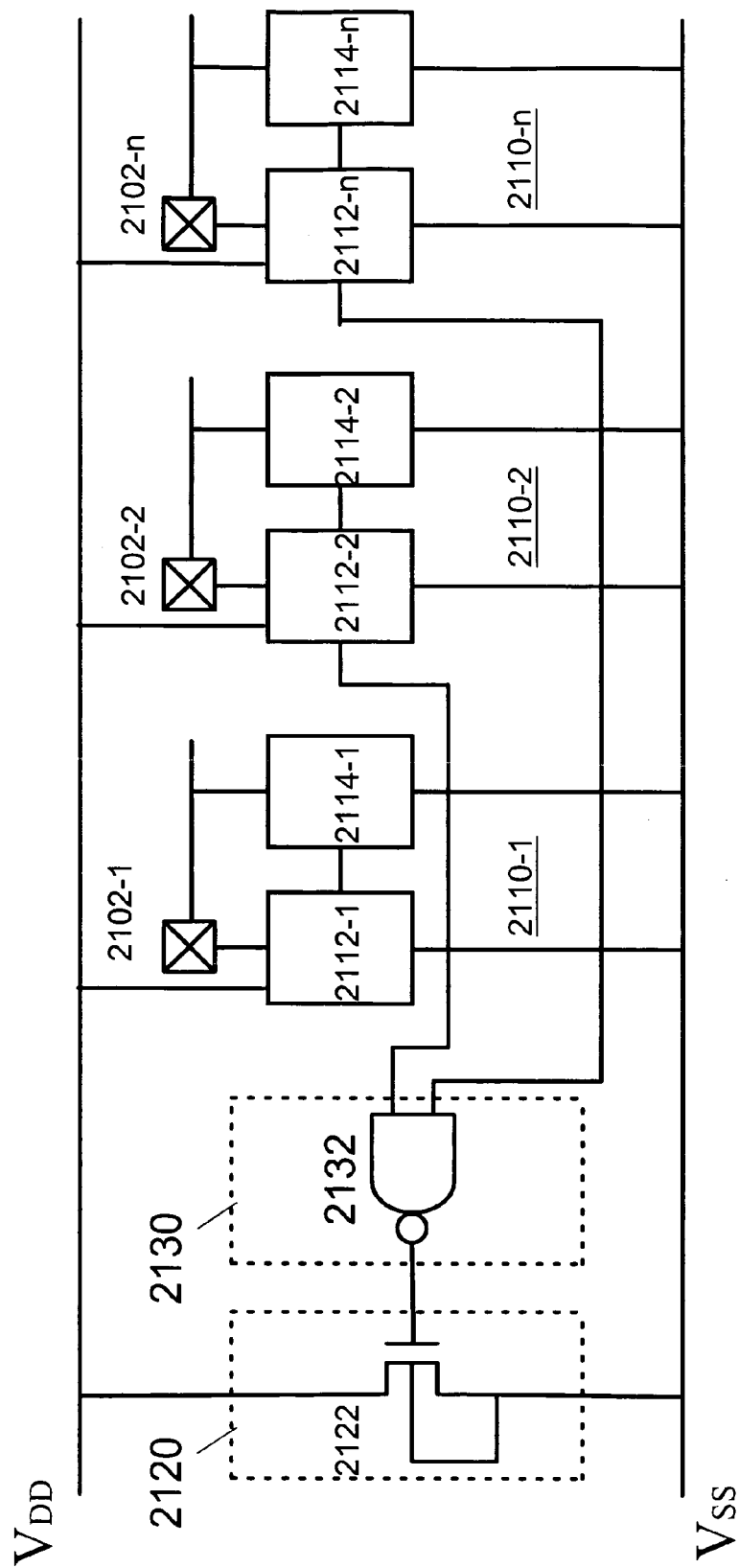
FIG. 21 is an ESD protection circuit providing protection against an ESD in any of PS, NS, PD and ND modes consistent with another embodiment of the present invention.

FIG. 21 shows a circuit 2100 that provides ESD protection for an IC having multiple high-voltage-tolerant input pads 2102-1, 2102-2, . . . , 2102-n. ESD protection circuit 2110-x is associated with input pad 2102-x, x being a number from 1 to n. ESD protection circuit 2110-x comprises an ESD detection circuit 2112-x and a Pad-$V_{SS}$ clamping circuit 2114-x. Circuit 2100 also includes a $V_{pp}$-$V_{SS}$ clamping circuit 2120 and a logic circuit 2130. $V_{DD}$-$V_{SS}$ clamping circuit 2120 comprises an NMOS transistor 2122 having a gate. Each ESD detection circuit 2112-x is coupled to the gate of NMOS transistor 2122 through logic circuit 2130.

When an ESD in any of the four modes appears on any of input pads 2102-x, Pad-$V_{SS}$ clamping circuit 2114-x will discharge the ESD from input pad 2102-x to $V_{SS}$.

When an ESD in ND mode appears on any one of input pads 2102-x, the corresponding ESD detection circuit 2102-x outputs a signal to NMOS transistor 2122 through logic circuit 2130 to turn on NMOS transistor 2122 to conduct the ESD from $V_{SS}$ to $V_{DD}$. Particularly, FIG. 21 shows that logic circuit 2130 comprises a NAND gate 2132. When an ESD in PD mode appears on any of input pads 2102-x, a parasitic diode between a substrate and a drain of NMOS transistors 2122 will be turned on to conduct the ESD from $V_{SS}$ to $V_{DD}$.

Figure 22:
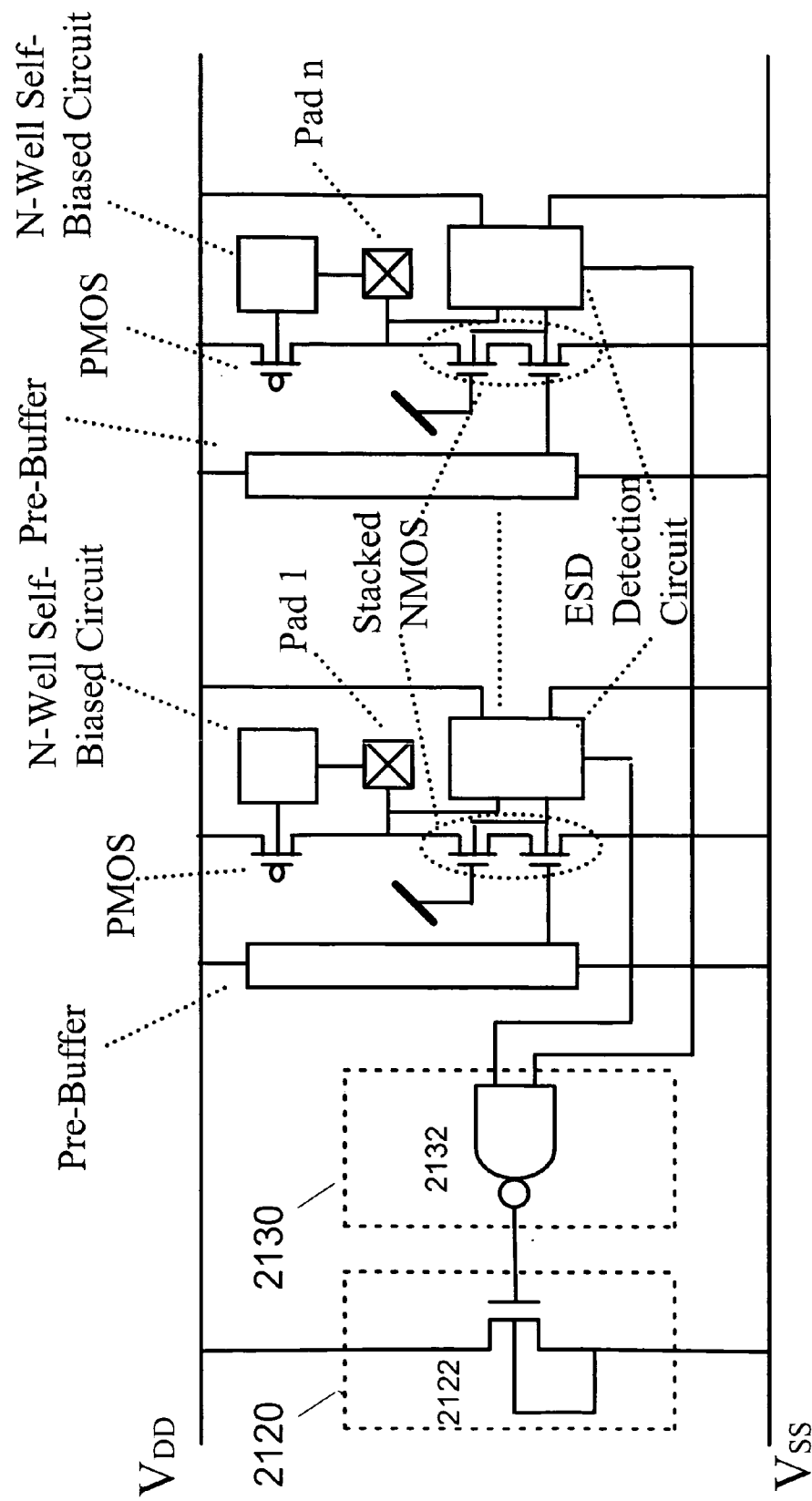
FIG. 22 is an ESD protection circuit providing protection against an ESD in any of PS, NS, PD and ND modes consistent with another embodiment of the present invention.

FIG. 22 shows a circuit that provides ESD protection for an IC with multiple mixed-voltage I/O pads against an ESD in any one of the four modes.

Figure 23:
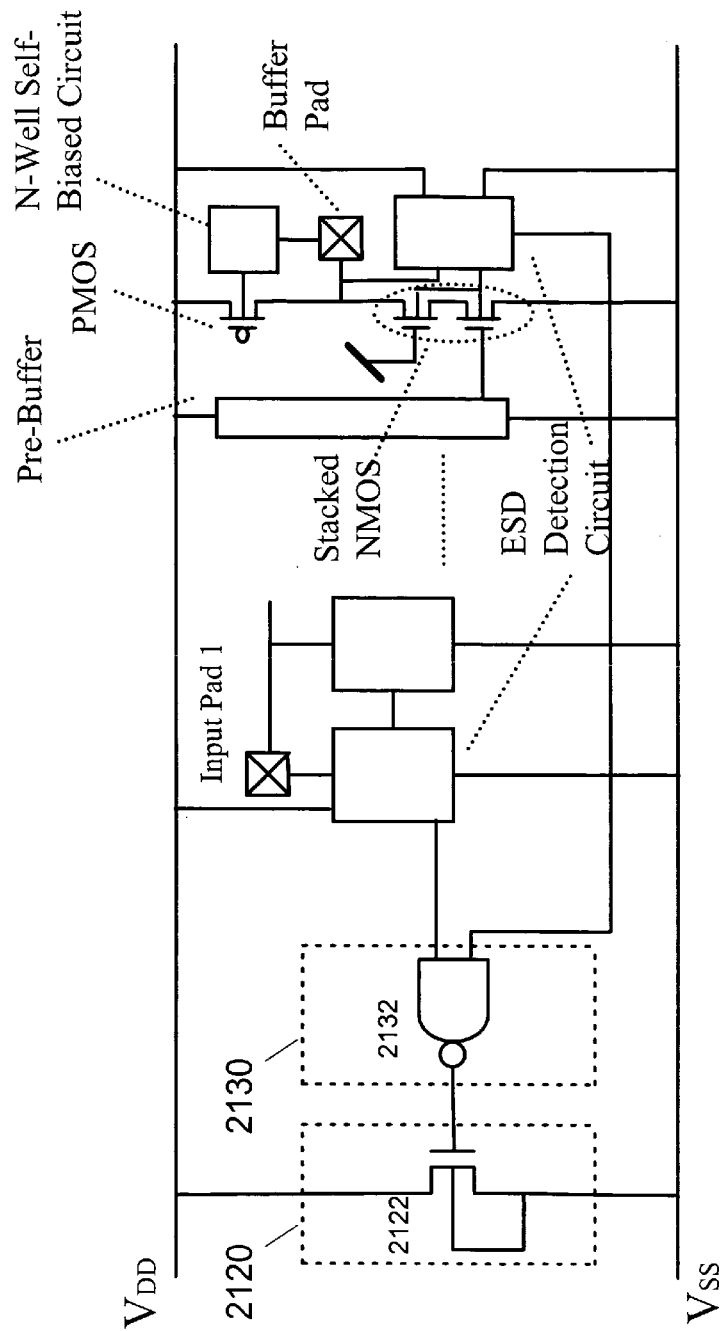
FIG. 23 is an ESD protection circuit providing protection against an ESD in any of PS, NS, PD and ND modes consistent with another embodiment of the present invention.

FIG. 23 shows a circuit that provides ESD protection for an IC with a mixture of multiple mixed-voltage I/O pads and multiple high-voltage-tolerant input pads against an ESD in any one of the four modes.

The operations of the circuits shown in FIGS. 22 and 23 are similar to those already described in detail. One skilled in the art would understand the operations thereof and therefore they will not be explained herein.

Figure 24:
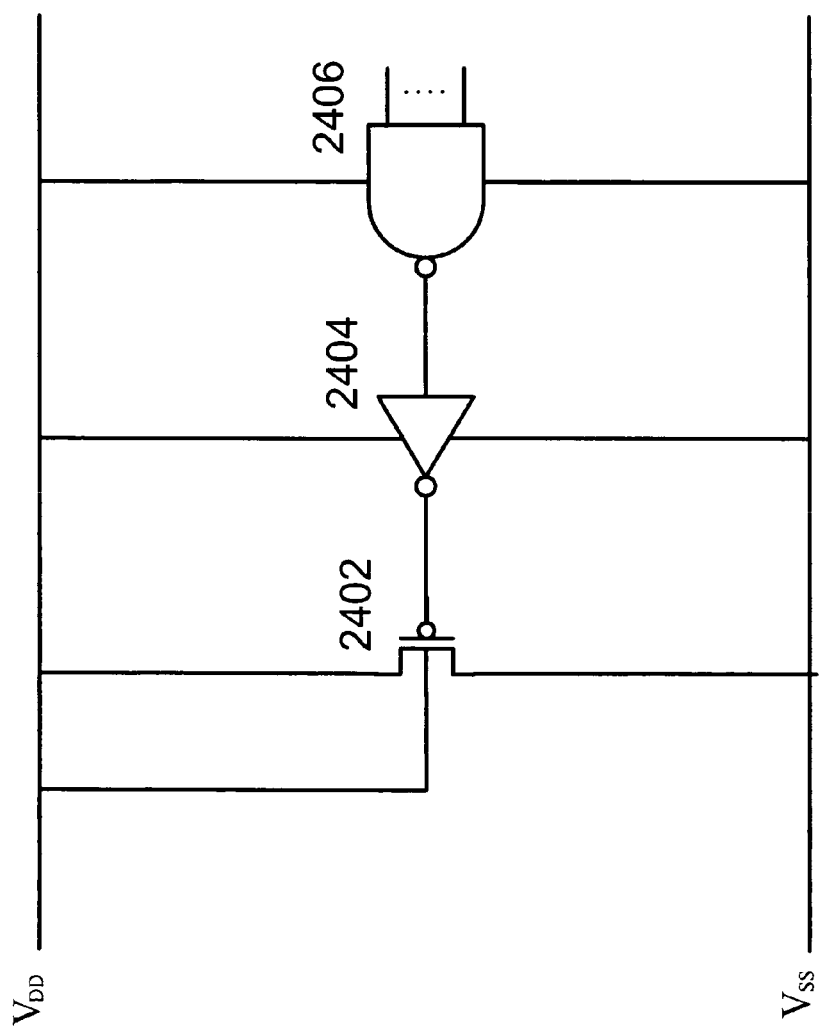
FIG. 24 is a $V_{DD}$-$V_{SS}$ clamping circuit consistent with one embodiment of the present invention.

Exemplary variations of the $V_{DD}$-$V_{SS}$ clamping circuits and the logic circuits discussed above and shown in FIGS. 21-23 are shown in FIGS. 24-27. Referring to FIG. 24, a PMOS transistor 2402 is driven by an inverter 2404 serially coupled to a NAND gate 2406.

Figure 25:
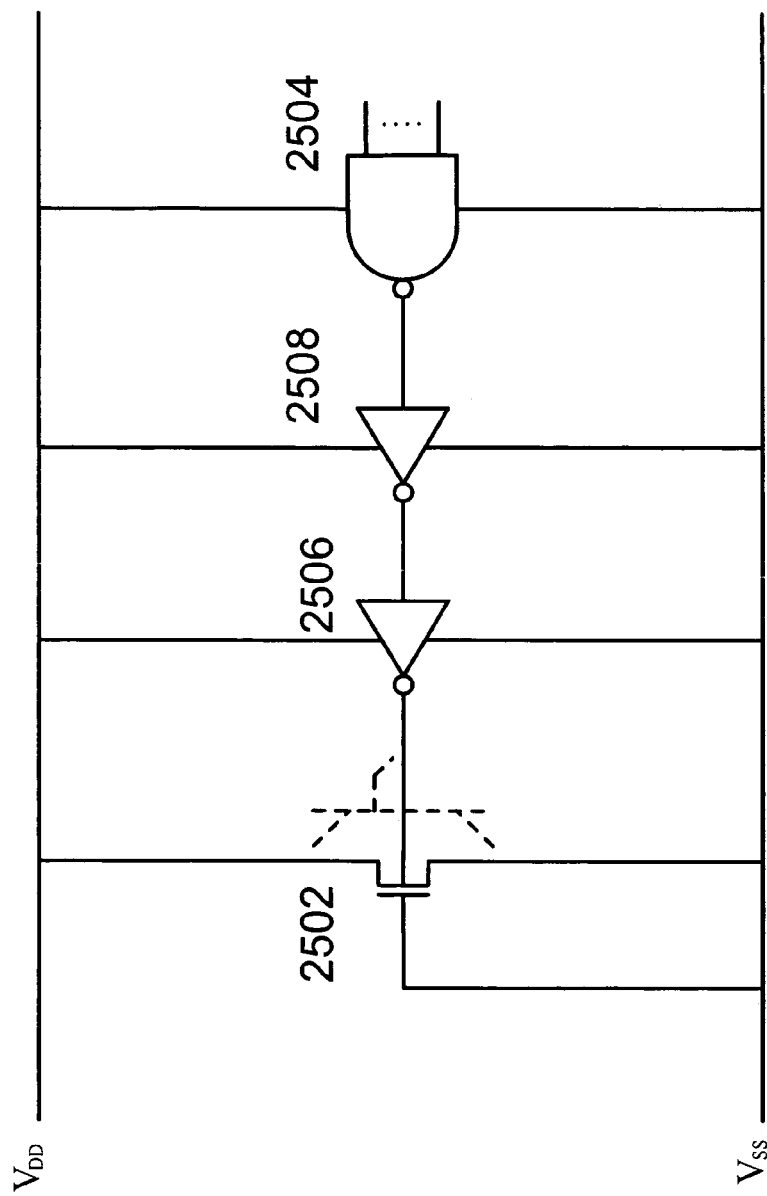
FIG. 25 is a $V_{DD}$-$V_{SS}$ clamping circuit consistent with another embodiment of the present invention.

In FIG. 25, an NMOS transistor 2502 is used with a NAND gate 2504 and two inverters 2506 and 2508.

Figure 26:
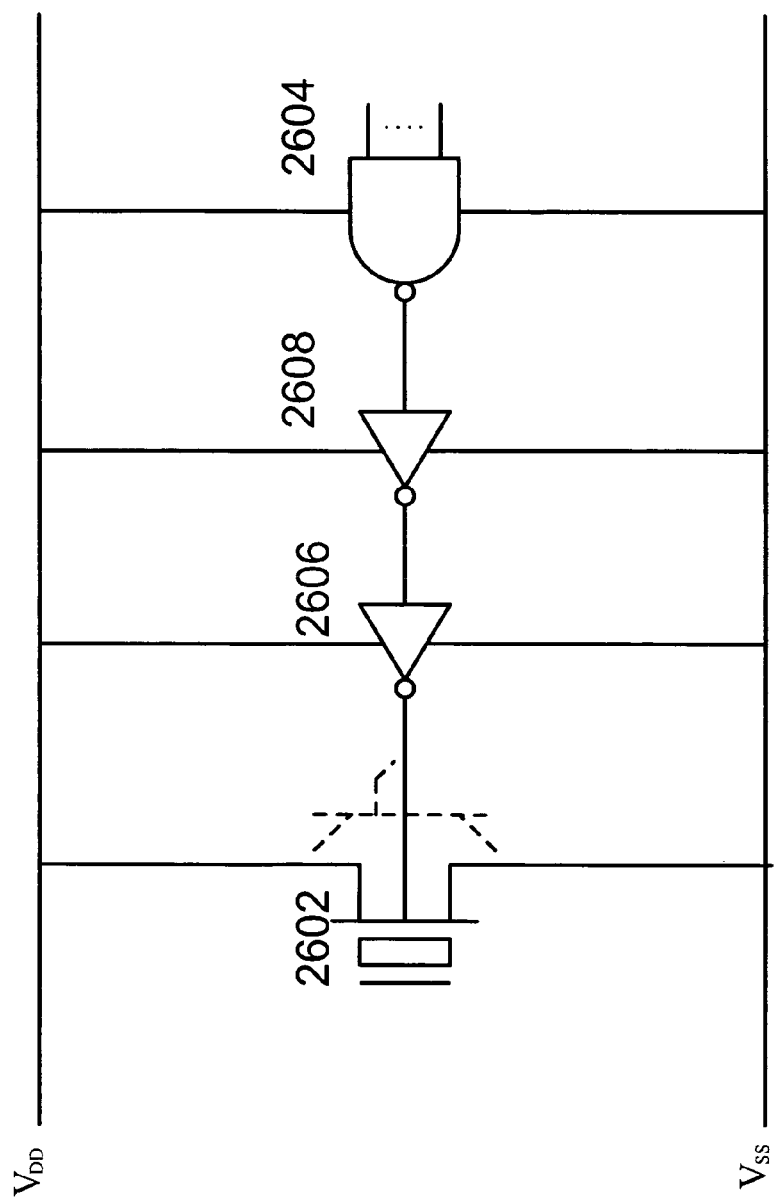
FIG. 26 is a $V_{DD}$-$V_{SS}$ clamping circuit consistent with another embodiment of the present invention.

In FIG. 26, an FOD 2602 is used with a NAND gate 2604 and two inverters 2606 and 2608.

Figure 27:
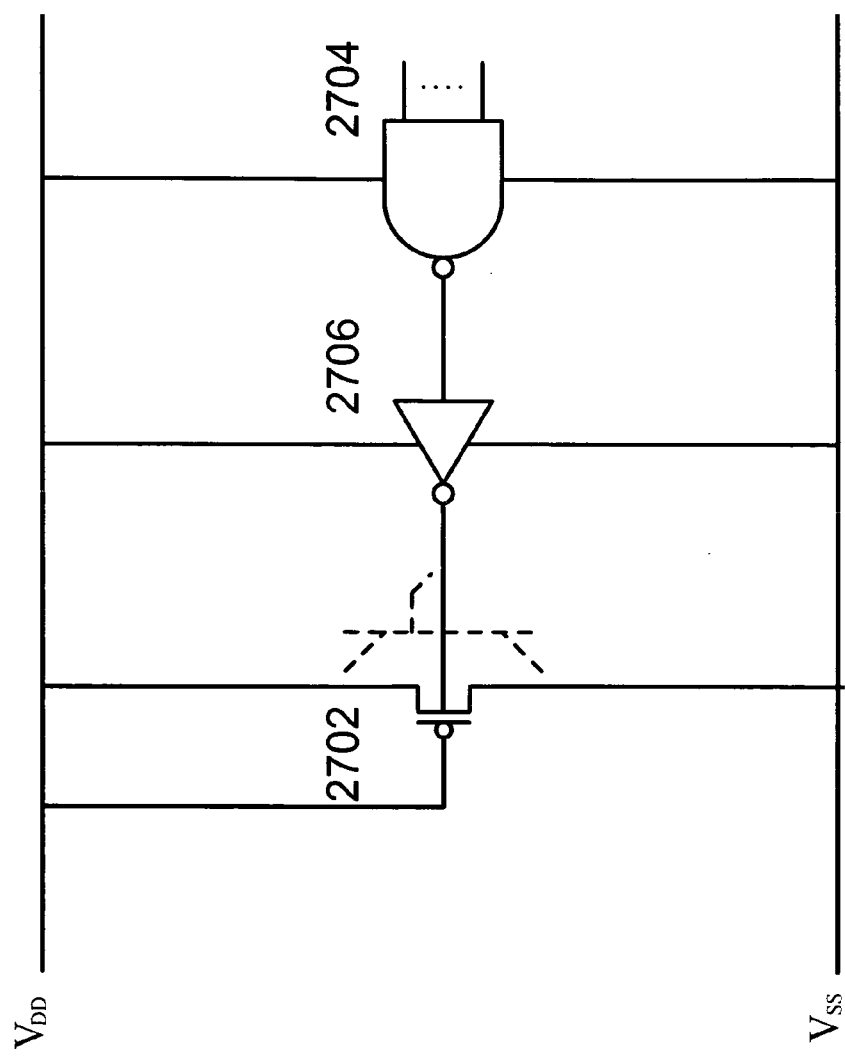
FIG. 27 is a $V_{DD}$-$V_{SS}$ clamping circuit consistent with yet another embodiment of the present invention.

In FIG. 27, a PMOS transistor 2702 is used with a NAND gate 2704 and an inverter 2706. Inverter 2706 is coupled to a substrate of PMOS transistor 2702.

The operations of the circuits shown in FIGS. 24-27 are similar to those already described in detail. One skilled in the art would understand the operations thereof and therefore they will not be explained herein.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A buffer circuit comprising:
a pad;
an electrostatic discharge (ESD) detection circuit coupled to the pad capable of detecting an ESD on the pad; and
a first circuit coupled to the pad and the ESD detection circuit and connectable to a first potential capable of discharging the ESD on the pad, the first circuit comprising a first plurality of stacked MOS transistors, each transistor having a source, a drain, a gate, and a substrate,
wherein the ESD detection circuit is connected to the gates of the stacked MOS transistors and capable of providing at least a first signal to the first circuit under normal operation conditions and at least a second signal to the first circuit when the ESD detection circuit detects the ESD on the pad.

2. The circuit of claim 1, wherein the pad comprises a high-voltage-tolerant input pad.

3. The circuit of claim 1, wherein the first potential comprises ground.

4. The circuit of claim 1, wherein the first potential comprises $V_{DD}$.

5. The circuit of claim 1, wherein the ESD detection circuit comprises an inverter.

6. The circuit of claim 1, further comprising a capacitor coupled to the pad, wherein the capacitor couples the ESD to the ESD detection circuit.

7. The circuit of claim 1, further comprising a transistor having a substrate coupled to the first circuit and a capacitor coupled between the pad and the substrate of the transistor, wherein the ESD is coupled to the first circuit through the capacitor and the transistor.

8. The circuit of claim 1, wherein the first signal turns off the first circuit and the second signal turns on the first circuit.

9. The circuit of claim 1, wherein the plurality of stacked MOS transistors comprise two NMOS transistors coupled to the ESD detection circuit.

10. The circuit of claim 1, wherein the first signal and the second signal are coupled to the gate of one of the plurality of stacked MOS transistors, and wherein the first signal has a voltage level lower than a threshold of the one of the plurality of stacked MOS transistors and the second signal has a voltage level higher than the threshold voltage of the one of the plurality of stacked MOS transistors.

11. The circuit of claim 1, wherein the plurality of stacked MOS transistors form a parasitic lateral bipolar junction transistor (LBJT), wherein the first signal and the second signal are coupled to the substrate of one of the plurality of stacked MOS transistors, the second signal being a substrate-triggered current signal, and wherein the second signal turns on the LBJT when the ESD detection circuit detects the ESD on the pad.

12. The circuit of claim 1, further comprising a driver circuit coupled to the pad, wherein the driver circuit comprises a second plurality of stacked NMOS transistors.

13. The circuit of claim 1, wherein the first circuit further comprises a PMOS transistor coupled to the plurality of stacked NMOS transistors, and wherein the first circuit is also a driver circuit.

14. The circuit of claim 1, further comprising a clamping circuit capable of providing an ESD discharging path between the first potential and a second potential, wherein the ESD detection circuit is coupled to the clamping circuit through a logic circuit to trigger the clamping circuit to discharge the ESD.

15. The circuit of claim 14, wherein the clamping circuit comprises an NMOS transistor coupled to the logic circuit.

16. The circuit of claim 14, wherein the clamping circuit comprises a PMOS transistor coupled to the logic circuit.

17. The circuit of claim 14, wherein the clamping circuit comprises a field oxide device (FOD) coupled to the logic circuit.

18. The circuit of claim 14, wherein the logic circuit comprises an inverter coupled between the ESD detection circuit and the clamping circuit.

19. An integrated circuit (IC) connectable to a first potential and a second potential, comprising:
at least one electrostatic discharge (ESD) protection circuit, each comprising
a pad,
an ESD detection circuit coupled to the pad capable of detecting an ESD on the pad, and
a first clamping circuit coupled to the pad and the ESD detection circuit capable of discharging the ESD to the first potential,
wherein the ESD detection circuit is capable of providing at least a first signal to the first clamping circuit under normal operation conditions of the IC and at least a second signal to the first clamping circuit for triggering the first clamping circuit to discharge the ESD to the first potential under an ESD stress condition; and
a second clamping circuit connectable to the first and second potentials capable of providing an ESD discharging path between the first and second potentials,
wherein the ESD detection circuit of each of the at least one ESD protection circuit is coupled to the second clamping circuit through a logic circuit.

20. The circuit of claim 19, wherein the first signal has a voltage level lower than that of the second signal.

21. The circuit of claim 19, wherein the first clamping circuit comprises a plurality of stacked NMOS transistors, and wherein the first and second signals are coupled to the gate or the substrate of one of the plurality of stacked NMOS transistors.

22. The circuit of claim 19, wherein the first clamping circuit comprises a field oxide device (FOD), and wherein the first and second signals are coupled to a substrate of the FOD.

23. The circuit of claim 19, wherein the first clamping circuit is also a driver circuit.

24. The circuit of claim 19, wherein the second clamping circuit is turned on for ESD protection when at least one of the ESD detection circuits of the at least one ESD protection circuit detects an ESD on the pad and when the first potential is floating.

25. The circuit of claim 19, wherein the second clamping circuit comprises a MOS transistor, and wherein the ESD detection circuit of each of the at least one ESD protection circuit is coupled to the gate or the substrate of the MOS transistor trough the logic circuit.

26. The circuit of claim 19, wherein the second clamping circuit comprises a field oxide device (FOD), and Wherein the ESD detection circuit of each of the at least one ESD protection circuit is coupled to a substrate of the FOD through the logic circuit.

27. The circuit of claim 19, wherein the second clamping circuit comprises a parasitic lateral bipolar junction transistor (LBJT), and wherein the LBJT is turned on to discharge the ESD when at least one of the ESD detection circuits of the at least one ESD protection circuit detects the ESD on the pad and when the first potential is floating.

28. The circuit of claim 19, wherein the logic circuit comprises a NAND gate and at least one inverter coupled to the second clamping circuit.

29. An integrated circuit (IC) connectable to a first potential and a second potential, comprising:
a plurality of first electrostatic discharge (ESD) protection circuits, each comprising
an input pad,
an ESD detection circuit coupled to the input pad capable of detecting an ESD on the input pad, and
a first clamping circuit coupled to the input pad and the first ESD detection circuit capable of discharging the ESD on the input pad to the first potential;
a plurality of second ESD protection circuits, each comprising
a contact pad,
a driver circuit coupled to the contact pad, and
an ESD detection circuit capable of detecting an ESD on the contact pad; and
a second clamping circuit connectable to the first and second potentials capable of discharging an ESD,
wherein the ESD detection circuit of each of the plurality of first ESD protection circuits and the plurality of second ESD protection circuits is coupled to the second clamping circuit through a logic circuit.

30. The circuit of claim 29, wherein the second clamping circuit is turned on for providing an ESD discharging path between the first and second potentials when at least one of the ESD detection circuits of the plurality of first ESD protection circuits or the plurality of second ESD protection circuits detects the ESD and when the first potential is floating.

31. The circuit of claim 29, wherein at least one of the plurality of first ESD protection circuits or the plurality of second ESD protection circuits comprises at least one NMOS transistor, and wherein the ESD detection circuit of the at least one of the plurality of first ESD protection circuits or the plurality of second ESD protection circuits is coupled to one of a gate and substrate of the NMOS transistor.

32. The circuit of claim 29, wherein at least one of the plurality of first ESD protection circuits or the plurality of second ESD protection circuits comprises a field oxide device (FOD), and wherein the ESD detection circuit of the at least one of the plurality of first ESD protection circuits or the plurality of second ESD protection circuits is coupled to a substrate of the FOD.

33. The circuit of claim 29, wherein the driver circuit of at least one of the plurality of second ESD protection circuits is capable of discharging an ESD on the contact pad of the at least one of the plurality of second ESD protection circuits, when the ESD detection circuit of the at least one of the plurality of second ESD protection circuits detects the ESD on the contact pad of the at least one of the plurality of second ESD protection circuits.

34. The circuit of claim 29, wherein at least one of the plurality of second ESD protection circuits further comprises a third clamping circuit coupled to the contact pad and the ESD detection circuit of the at least one of the plurality of second ESD protection circuits capable of discharging an ESD on the contact pad of the at least one of the plurality of second ESD protection circuits.

35. A method for providing an electrostatic discharge (ESD) protection for an integrated circuit (IC), comprising:
coupling an ESD detection circuit capable of detecting an ESD to a pad; and
providing an ESD discharging circuit capable of discharging the ESD to a first power supply terminal, wherein the ESD discharging circuit comprises a plurality of stacked NMOS transistors, each NMOS transistor having a source, a drain, a gate, and a substrate, and wherein providing the ESD discharging circuit comprises coupling the ESD detection circuit to the gates of the stacked NMOS transistors.

* * * * *